US008788903B2

(12) United States Patent  
Kishigami et al.

(10) Patent No.: US 8,788,903 B2  
(45) Date of Patent: Jul. 22, 2014

(54) WIRELESS TRANSMISSION DEVICE, WIRELESS RECEIVING DEVICE, AND METHOD FOR TRANSMITTING ENCODED DATA

(75) Inventors: Takaaki Kishigami, Tokyo (JP); Isamu Yoshii, Kanagawa (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 258 days.

(21) Appl. No.: 13/123,860

(22) PCT Filed: Oct. 22, 2009

(86) PCT No.: PCT/JP2009/005536  
§ 371 (c)(1),  
(2), (4) Date: Apr. 12, 2011

(87) PCT Pub. No.: WO2010/047111  
PCT Pub. Date: Apr. 29, 2010

(65) Prior Publication Data  
US 2011/0197106 A1  Aug. 11, 2011

(30) Foreign Application Priority Data

Oct. 23, 2008 (JP) .................................. 2008-273442

(51) Int. Cl.  
*H03M 13/00* (2006.01)

(52) U.S. Cl.  
USPC ........................................................ 714/755

(58) Field of Classification Search  
USPC ............................................. 714/755, E11.032  
See application file for complete search history.

(56) References Cited

U.S. PATENT DOCUMENTS 5,896,374 A * 4/1999 Okumura et al. ............. 370/311  
6,154,866 A  11/2000 Kawahara  
(Continued)

FOREIGN PATENT DOCUMENTS

JP  3-135116   6/1991  
JP  2002-43953  2/2002  
(Continued)

OTHER PUBLICATIONS

International Search Report dated Jan. 12, 2010.

(Continued)

*Primary Examiner* — Ajay Bhatia  
*Assistant Examiner* — Thien D Nguyen  
(74) *Attorney, Agent, or Firm* — Dickinson Wright PLLC

(57) ABSTRACT

Disclosed are a wireless transmission device, wireless receiving device, and method for transmitting encoded data with which power consumption can be reduced at the receiving end in accordance with reception conditions, while resource-saving is maintained by employing an erasure correcting code (ECC). In a wireless communication device (100), an erasure correction encoding unit (110) performs erasure correction encoding (ECC) of the transmission data and an error correction encoding unit (145) performs encoding, using an error correction encoding system other than the erasure correction encoding, of other copied transmission data from the transmission data and the ECC parity bits obtained by the erasure correction encoding unit (110), respectively independently, and a transmission unit (165) in the error correction encoding unit (145) transmits as information bits only systematic bits obtained from the other transmission data and, in the error correction encoding unit (145), transmits as parity bits the encoding results obtained from the other transmission data and ECC parity bits.

15 Claims, 33 Drawing Sheets

(56) References Cited

U.S. PATENT DOCUMENTS

| | | |
|---|---|---|
| 2002/0016944 A1 | 2/2002 | Yoshida |
| 2004/0090997 A1* | 5/2004 | Choi et al. .................... 370/535 |
| 2004/0158873 A1* | 8/2004 | Pasqualino .................... 725/131 |
| 2007/0266300 A1* | 11/2007 | Ito et al. ........................ 714/770 |
| 2007/0283214 A1* | 12/2007 | Lasser ........................... 714/758 |
| 2009/0125778 A1* | 5/2009 | Uchida et al. ................. 714/749 |
| 2009/0241008 A1* | 9/2009 | Kim et al. ..................... 714/755 |
| 2009/0287981 A1* | 11/2009 | Kimura et al. ................ 714/752 |
| 2010/0135380 A1* | 6/2010 | Pasqualino .............. 375/240.01 |
| 2011/0113307 A1* | 5/2011 | Kang et al. ................... 714/786 |
| 2011/0223924 A1* | 9/2011 | Lohr et al. .................... 455/450 |

FOREIGN PATENT DOCUMENTS

| | | |
|---|---|---|
| JP | 2003-168984 | 6/2003 |
| JP | 2006-108812 | 4/2006 |
| JP | 2006-135584 | 5/2006 |
| JP | 2006-303793 | 11/2006 |
| JP | 2007-324699 | 12/2007 |
| JP | 2008-124613 | 5/2008 |
| WO | 98/14940 | 4/1998 |
| WO | 2007/069406 | 6/2007 |

OTHER PUBLICATIONS

K. Stanwood, et al., "Optional outer-coded data mode for MBS," IEEE 802.16 Broadband Wireless Access Working Group <http://ieee802.org/16>, IEEE C802.16maint-08/293, Sep. 11, 2008, pp. 1-16.

* cited by examiner

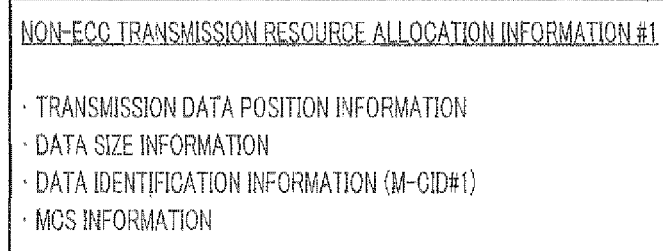
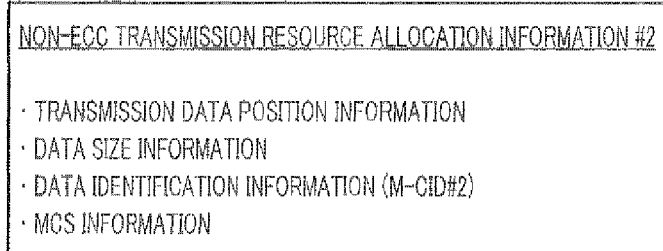
FIG.18A
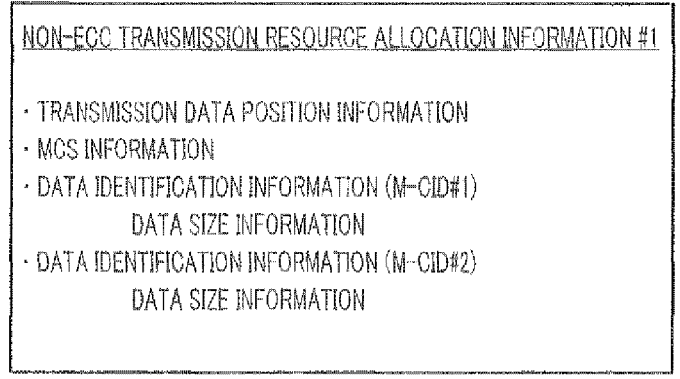
FIG.18B

WIRELESS TRANSMISSION DEVICE, WIRELESS RECEIVING DEVICE, AND METHOD FOR TRANSMITTING ENCODED DATA

TECHNICAL FIELD

The present invention relates to a radio transmitting apparatus, a radio receiving apparatus and an encoded data transmitting method that performs error correcting coding on transmission data and transmits the encoded data.

BACKGROUND ART

Application of MBS (Multicast Broadcast Service) to various radio communication systems (e.g. 3GPP, WiMAX) is under study or is being started. Furthermore, there are demands for further increases in capacity such as streaming delivery concurrently with higher quality.

One technique to improve quality of MBS is application of coding technique. That is, as shown in FIG. 1, a first method is a method using low rate error correction code (FEC: Forward error correction) (see FIG. 1A) and a second method is a method using erasure correction code (ECC) as an outer code of FEC (see FIG. 1B). FIG. 1 shows a packet configuration example using systematic code. Here, R in FIG. 1 denotes a coding rate (where $0<R\leq1$).

Furthermore, application of ECC to an application layer or transport layer is conventionally under study and has already been standardized in DVB-H, 3GPP 26.346 MBMS, DVB-IPI (IPTV) or the like. Furthermore, application of ECC in a MAC layer is beginning to be studied aiming at obtaining an effect of reducing the amount of information and transmission delay in higher layers (e.g. see non-patent literature 1, patent literature 1 and patent literature 2). Various studies on codes used for ECC are under way, and for example, Reed-Solomon code, LDPC (Low-density parity-check code) code or the like can be applied.

CITATION LIST

Patent Literature

PTL 1

WO2007/069406 pamphlet

PTL 2

Japanese Patent Application Laid-Open No. 2008-124613

Non-Patent Literature

NPL 1

IEEE C802.16maint-08/293 Optional outer coded data mode for MBS (Ken Stanwood, Yoav Nebat, Lei Wang, Erik Colban, Yair Bourlas; 2008 Sep. 10)

SUMMARY OF INVENTION

Technical Problem

ECC is an error correction method capable of correcting more data than normal FEC by giving error positions beforehand. This is attributable to the fact that, while with normal FEC the positions and magnitude of errors need to be calculated, only the magnitude of errors needs to be calculated with ECC. Therefore, compared to the first method, the above-described second method can achieve predetermined receiving quality even at a high rate (high coding rate). That is, the second method can achieve predetermined receiving quality using fewer frequencies/time resources than the first method (that is, having resource-saving effect).

However, since MBS transmission on a downlink is required to satisfy predetermined receiving quality for all MSs subject to MBS in a cell, when the above-described first method (that is, FEC at a low rate) is used, attempting to secure quality of an MS (terminal) in the vicinity of a cell edge in particular requires more resources.

On the other hand, when the above-described second method is used for MBS transmission, predetermined receiving quality can be satisfied with fewer resources compared to the above-described first method, whereas an MS near the center of the cell can achieve sufficient quality with conventional FEC but applying ECC not only results in excessive quality but also causes a problem of increasing power consumption of the MS due to ECC decoding processing.

It is an object of the present invention to provide a radio transmitting apparatus, a radio receiving apparatus and an encoded data transmitting method capable of reducing power consumption on the receiving side according to a receiving condition while maintaining the resource-saving effect of application of ECC.

Solution to Problem

A radio transmitting apparatus of the present invention adopts a configuration including a first encoding section that encodes transmission data using a first encoding method and outputs first encoded transmission data, a second encoding section that encodes the transmission data and the first encoded transmission data using a second encoding method and outputs second encoded transmission data and a transmission section that transmits the second encoded transmission data wherein the second encoding section encodes the transmission data and the first encoded transmission data separately.

An encoded data transmitting method of the present invention includes: encoding transmission data using a first encoding method and outputting first encoded transmission data; encoding the transmission data and the first encoded transmission data using a second encoding method and outputting second encoded transmission data; and transmitting the second encoded transmission data, wherein, with the second encoding method, the transmission data and the first encoded transmission data are encoded separately.

A radio receiving apparatus of the present invention adopts a configuration including a receiving section that receives first data generated by encoding transmission data using a first encoding method and a second encoding method and second data generated by encoding the transmission data using the second encoding method, a first decoding processing section that decodes the second data, an error detection section that performs error detection of the decoding result of the first decoding processing section, a deciding section that decides whether or not second decoding processing is necessary based on a condition of the error detection and a second decoding section that decodes, when the decision result shows that the second decoding processing is necessary, the first data through the second decoding processing.

Advantageous Effects of Invention

According to the present invention, it is possible to provide a radio transmitting apparatus, a radio receiving apparatus and an encoded data transmitting method capable of reducing power consumption on the receiving side according to a receiving condition while maintaining a resource-saving effect by application of ECC.

BRIEF DESCRIPTION OF DRAWINGS

FIG. 11 is a schematic diagram of steps of decoding processing or the like;

FIG. 18 is a diagram illustrating variations of allocation information format;

FIG. 33 is a schematic diagram of steps of decoding processing or the like.

DESCRIPTION OF EMBODIMENTS

Figure 1A:
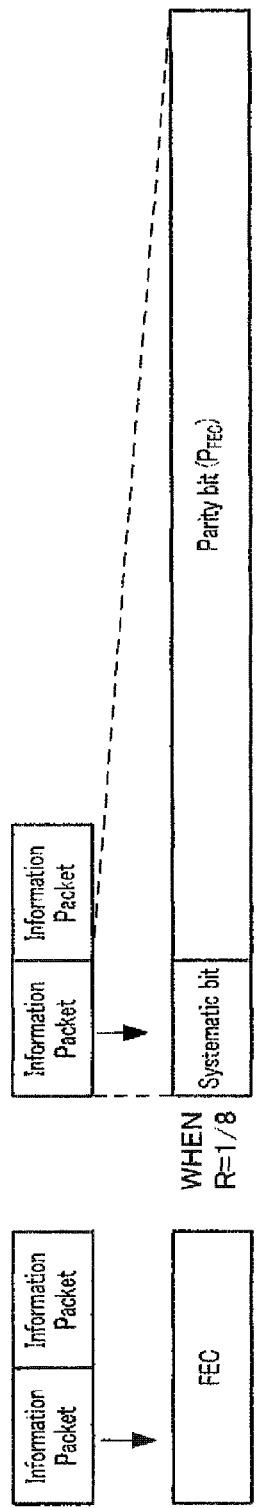
FIG. 1 is a diagram illustrating a technique of improving quality of MBS.

Hereinafter, embodiments of the present invention will be described in detail with reference to the accompanying drawings. The same components among the embodiments will be assigned the same reference numerals and overlapping descriptions thereof will be omitted.

Embodiment 1

Figure 2:
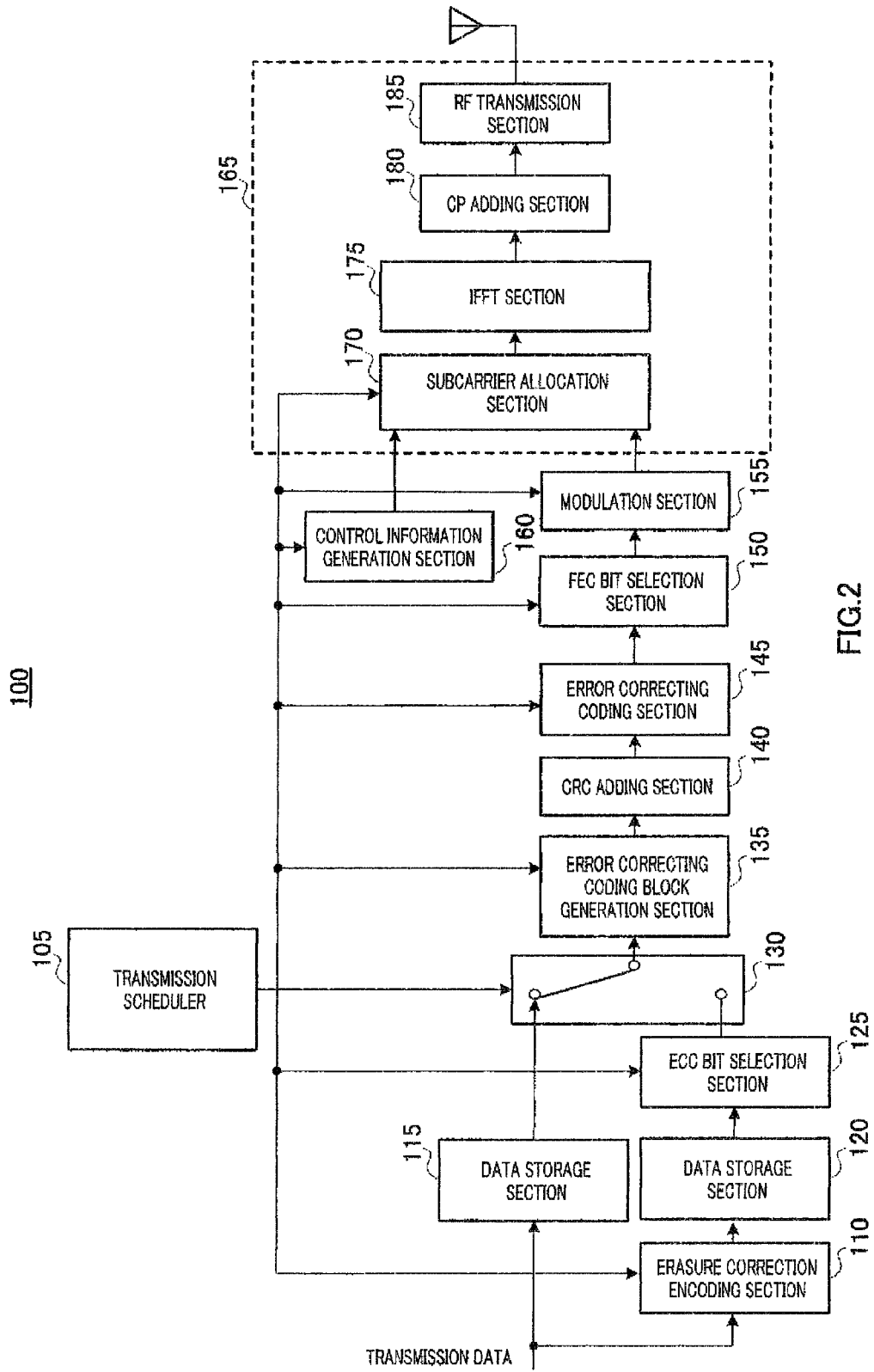
FIG. 2 is a block diagram illustrating a configuration of a radio communication apparatus according to Embodiment 1 of the present invention.

FIG. 2 is a block diagram illustrating a configuration of radio communication apparatus 100 according to Embodiment 1. In FIG. 2, radio communication apparatus 100 includes transmission scheduler 105, erasure correction coding (ECC) section 310, first data storage section 115, second data storage section 120, ECC bit selection section 125, switch 130, error correcting coding block generation section 135, CRC adding section 140, error correcting coding (FCC) section 145, FEC bit selection section 150, modulation section 155, control information generation section 160 and transmitting section 165. Here, since radio communication apparatus 100 transmits an OFDM signal, transmitting section 165 includes subcarrier allocation section 170, IFFT section 175, CP adding section 180 and RF transmission section 185. Radio communication apparatus 100 is, for example, a radio base station apparatus.

Transmission scheduler 105 allocates time and frequency resources to transmission data. Furthermore, transmission scheduler 105 determines coding rates of ECC and FEC used in allocated resources, M-ary modulation value used for ECC transmission data and FEC transmission data in modulation section 155, coding block length (also referred to as "bit size of a block to encode" or "information bit size") and transmission data size. Here, the ECC transmission data is transmission data transmitted via erasure correction encoding section 110 and the FEC transmission data is transmission data transmitted by bypassing erasure correction encoding section 110.

Data storage section 115 receives transmission data such as IP packets outputted from a higher layer and stores the transmission data on a temporary basis.

Erasure correction coding (ECC) section 110 receives the same transmission data as the transmission data stored on a temporary basis in data storage section 115. That is, data storage section 115 receives first transmission data as input, and erasure correction encoding section 110 receives second transmission data which is duplicated first transmission data as input. Erasure correction encoding section 110 then performs erasure correction coding on the second transmission data. Here, systematic codes are used for FEC carried out in the erasure correction coding and the error correcting coding section.

Erasure correction encoding section 110 divides the transmission data into portions of a predetermined size before performing erasure correction coding processing, and obtains a plurality of subblocks E(k). The predetermined size is determined based on an ECC coding block length (L_ECC) designated by transmission scheduler 105. Erasure correction encoding section 110 further adds a CRC (Cyclic Redundancy Check) bits to the transmission data subject to erasure correction coding before performing the erasure correction coding processing. Regarding the CRC adding method, CRC bits may be added to every divided L_ECC or may be added to one whole transmission data before division.

Here, k is a natural number between 1 and Kmax. Assuming the total number of bits of transmission data and CRC bits added thereto is Nb, Kmax is given according to Kmax=Ceil(Nb/L_ECC). Ceil(x) is an operator for performing processing of rounding up of decimal points of x. Furthermore, the information bit size of erasure correction L_ECC here is a size greater than coding block length L_FEC in the error correcting coding section. When the size falls short of a predetermined block size which is the processing unit of erasure correction coding, erasure correction encoding section 110 adjusts the size to the predetermined block size by zero padding (zero filling).

Erasure correction encoding section 110 performs erasure correction coding on the erasure correction coding unit calculated in this way and obtains systematic bit SE(k) and parity bit PE(k) in consequence. The systematic bit SE(k) and parity bit PE(k) are inputted to data storage section 120.

Data storage section 120 temporarily stores the systematic bit SE(k) and parity bit PE(k) received from erasure correction encoding section 110. Here, when a systematic bit is always not selected by ECC bit selection section 125, which will be described later, data storage section 120 may store only parity bit PE(k). By so doing, the storage capacity of data storage section 120 can be reduced.

Of systematic bit SE(k) and parity bit PE(k) received from erasure correction encoding section 110, ECC bit selection section 125 selects only parity bits and punctures the selected parity bits into a designated coding rate. The designated coding rate is a coding rate designated by the transmission scheduler. The parity bits selected by the ECC bit selection section may be referred to as "ECCP parity bits" hereinafter.

Switch 130 selectively outputs data stored in data storage section 115 or data obtained by ECC bit selection section 125 (that is, parity bit PE(k)) to error correcting coding block generation section 135. That is, by changing switch 130, transmission data stored in data storage section 115 and the ECC parity bits formed of second transmission data which is the duplicated transmission data are outputted to error correcting coding block generation section 135 by time division. Here, the ECC parity bits outputted to error correcting coding block generation section 135 may also be referred to as "ECC transmission data."

Error correcting coding block generation section 135 divides the transmission data received from data storage section 115 into portions of a predetermined size and obtains a plurality of subblocks S(j). The predetermined size is determined based on the information bit size (L_FEC) designated by transmission scheduler 105. Here, j is a natural number between 1 and Jmax. Assuming the total number of bits of transmission data and CRC bits added thereto is Nb, Jmax is given according to Jmax=Ceil(Nb/L_FCC). When the size falls short of a predetermined information bit size which is the processing unit of error correcting coding, error correcting coding block generation section 135 adjusts the size to a predetermined information bit size through zero padding (zero filling).

Furthermore, error correcting coding block generation section 135 divides the FCC transmission data into portions of a predetermined size and obtains subblock S(m). The predetermined size is determined based on an information bit size (L_FEC_ECC) designated by transmission scheduler 105. Here, m is a natural number between 1 and Mmax. Assuming the number of bits of the ECC transmission data is Nc, Mmax is given according to Mmax=Ceil(Nc/L_FEC_ECC).

CRC adding section 140 adds CRC (Cyclic Redundancy Check) bits of a predetermined bit length for every subblock. This allows the receiving side to perform error detection per subblock. Hereinafter, a CRC bit corresponding to subblock S(j) will be described as CRC(S(j)) and a CRC bit corresponding to subblock S(m) will be described as CRC(S(m)).

Error correcting coding section 145 performs error correcting coding using S(j) and CRC(S(j)) as one unit (that is, code block SF(j)) and obtains systematic bit SF(k) and parity bit PE(k) in consequence. These systematic bit SF(k) and parity bit PE(k) are inputted to FEC bit selection section 150.

Furthermore, error correcting coding section 145 performs error correcting coding using S(m) and CRC(S(m)) as one unit (that is, code block SF(m)) and obtains systematic bit SF and parity bit PE in consequence. These systematic bit SF and parity bit PE are inputted to FEC bit selection section 150. Here, systematic codes will be used for coding of FEC as described above.

FEC bit selection section 150 performs puncturing or repetition on systematic bit SF(k) and parity bit PE(k) received from error correcting coding section 145 as appropriate, thereby sets those bits to a designated coding rate and then outputs the bits to modulation section 155. Furthermore, FEC bit selection section 150 also performs puncturing or repetition on the systematic bit SF and parity bit PE received from error correcting coding section 145 as appropriate, sets those bits to a designated coding rate and then outputs the bits to modulation section 155. The designated coding rate is a coding rate designated by transmission scheduler 105.

Here, the transmission data processed by data storage section 115 to FEC bit selection section 150 by bypassing erasure correction encoding section 110 may be referred to as "non-ECC transmission data," and, on the other hand, the transmission data processed by erasure correction encoding section 110 to FEC bit selection section 150 may be referred to as "ECC transmission data."2

Modulation section 155 performs processing of mapping the output data (non-ECC transmission data, ECC transmission data) of FEC bit selection section 150 to symbol data based on the M-ary modulation value designated by transmission scheduler 105. Hereinafter, the modulation result obtained from non-ECC transmission data will be referred to as "non-ECC transmission symbol data," and, on the other hand, the modulation result obtained from the ECC transmission data may be referred to as "ECC transmission symbol data." A bit interleaver or subcarrier interleaver may also be provided before or after modulation section 155.

Control information generation section 160 generates control information to report the resource allocation information received from transmission scheduler 105 to radio terminal apparatus 200, which will be described later.

Transmitting section 165 transmits a transmission signal which is non-ECC transmission symbol data and ECC transmission symbol mapped to resources. Transmitting section 165 transmits non-ECC transmission symbol data and ECC transmission symbols using different packets. Here, transmitting section 165 transmits an OFDM signal.

To be more specific, in transmitting section 165, subcarrier allocation section 170 receives non-ECC transmission symbol data and ECC transmission symbols from modulation section 155. Subcarrier allocation section 170 allocates non-ECC transmission symbol data and ECC transmission symbol data to subcarriers in a predetermined OFDM symbol, based on resource allocation information received from transmission scheduler 105. Furthermore, subcarrier allocation section 170 receives control information from control information generation section 160 and maps the control information to predetermined time (OFDM symbol) and frequency (subcarrier) resources.

The transmission symbol data mapped to resources by subcarrier allocation section 170 is converted to a time-domain signal by IFFT section 175, and a CP is then added thereto by CP adding section 180. An OFDM signal is formed in this way. The OFDM signal is transmitted via RF transmission section 185.

Figure 3:
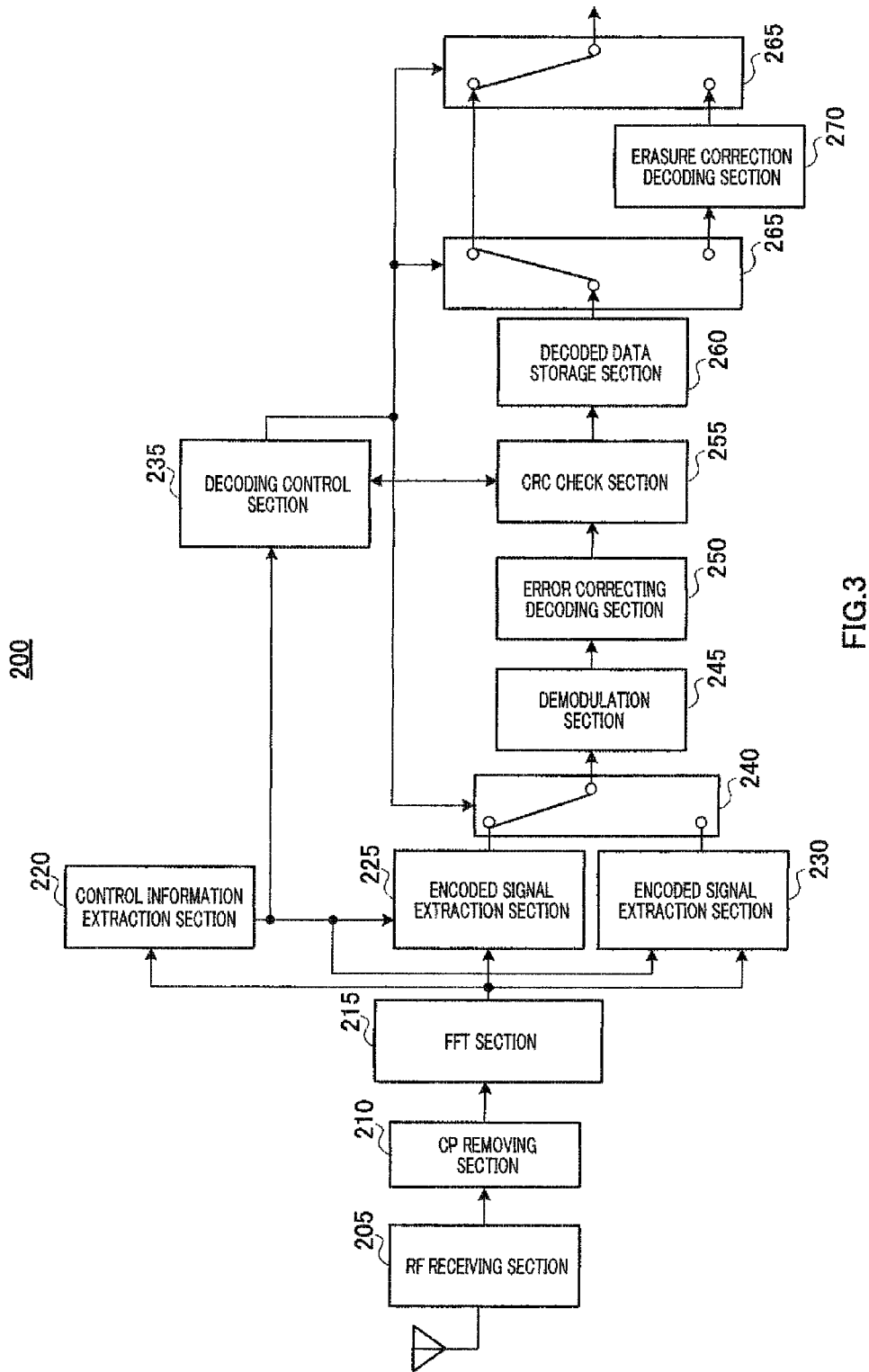
FIG. 3 is a diagram illustrating a configuration of a radio terminal apparatus according to Embodiment 1 of the present invention.

FIG. 3 is a block diagram illustrating a configuration of radio terminal apparatus 200 according to Embodiment 1.

In FIG. 3, radio terminal apparatus 200 includes RF receiving section 205, CP removing section 210, FFT section 215, control information extraction section 220, encoded signal extraction sections 225 and 230, decoding control section 235, switch 240, demodulation section 245, error correcting decoding section 250, CRC check section 255, decoded data storage section 260, switch 265 and erasure correction decoding section 270.

The OFDM signal transmitted from radio communication apparatus 100 is subjected to OFDM demodulation by RF receiving section 205, CP removing section 210 and FFT section 215.

Control information extraction section 220 extracts allocation information #1 corresponding to non-ECC symbol data and allocation information #2 corresponding to ECC symbol data from the received signal after the OFDM demodulation.

Encoded signal extraction section 225 extracts non-ECC symbol data from the received signal after the OFDM demodulation based on allocation information #1 extracted by control information extraction section 220.

Encoded signal extraction section 230 extracts ECC symbol data from the received signal after the OFDM demodulation based on allocation information #2 extracted by control information extraction section 220.

Decoding control section 235 associates non-ECC symbol data with ECC symbol data having common multicast identification information M-CID which is identification information of MBS data based on the control information extracted by control information extraction section 220 and performs decoding control on the associated data.

That is, decoding control section 235 changes the switch to the encoded signal extraction section 225 side and causes non-ECC symbol data to be outputted from encoded signal extraction section 225. Decoding control section 235 determines whether or not to perform error correcting decoding processing on the ECC symbol data extracted from encoded signal extraction section 230 based on the CRC detection result about all subblocks included in the non-ECC symbol data. To be more specific, when no error is detected in all subblocks, the decoding control section changes switch 240 to the encoded signal extraction section 230 side, and causes the ECC symbol data to be outputted from encoded signal extraction section 230. Thus, error detection decoding processing is applied to the ECC symbol data as well.

Furthermore, when no error is detected in all subblocks, decoding control section 235 changes switch 265 so that the output signal of decoded data storage section 260 is handed over to the following section by bypassing erasure correction decoding section 270. On the other hand, when errors are detected in at least some subblocks included in the non-ECC symbol data, decoding control section 235 changes switch 265 to the erasure correction decoding section 270 side and causes the decoded data stored in decoded data storage section 260 to be outputted to erasure correction decoding section 270.

Demodulation section 245 demodulates output data from encoded signal extraction section 225 and output data from encoded signal extraction section 230.

Error correcting decoding section 250 performs error correcting decoding on the demodulated data obtained from demodulation section 245.

CRC check section 255 checks whether or not there are errors in the error correcting decoding processing result. This CRC check is performed per subblock. The error decision result is outputted to decoding control section 235.

Decoded data storage section 260 temporarily stores the decoded data obtained from error correcting decoding section 250 and then outputs the decoded data to the following section.

Erasure correction decoding section 270 performs erasure correction decoding on the decoded data received from decoded data storage section 260.

Next, operations of radio communication apparatus 100 and radio terminal apparatus 200 having the above-described configuration will be described.

Figure 4:
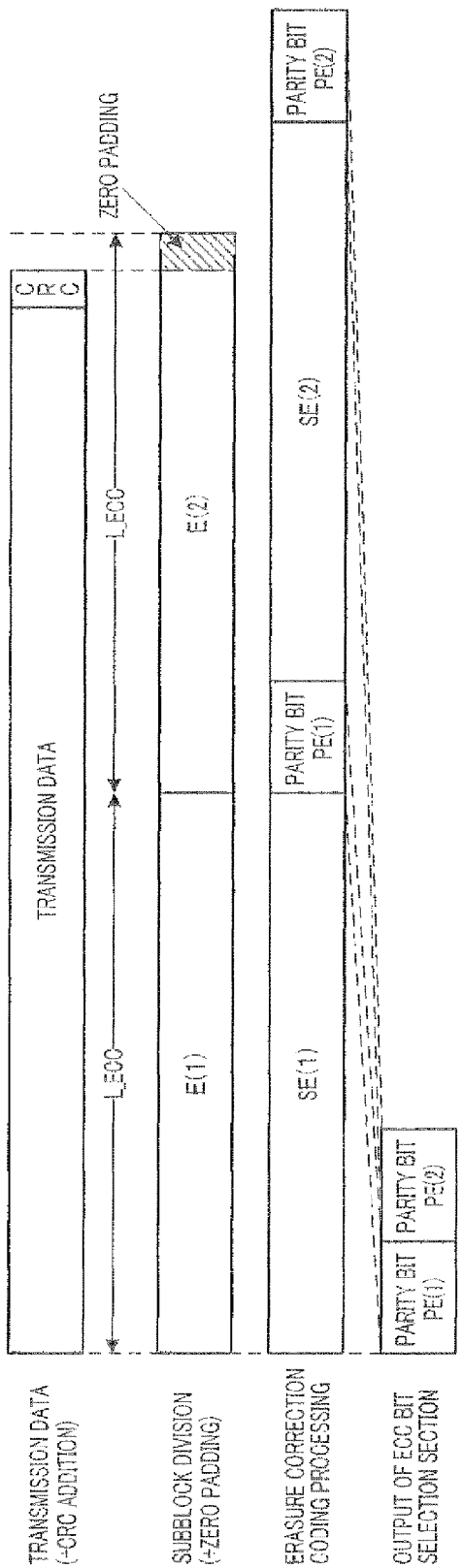
FIG. 4 is a diagram illustrating processing of an erasure correction encoding section and an ECC bit selection section.

FIG. 4 is a diagram illustrating processing of erasure correction encoding section 110 and ECC bit selection section 125. In FIG. 4, the aforementioned CRC adding method of adding CRC bits to on whole undivided transmission data is employed.

As shown in FIG. 4, erasure correction encoding section 110 adds CRC bits to the transmission data. The transmission data with CRC bits added, is divided per L_ECC. Since k=2 here, two subblocks E(1) and E(2) are obtained. Since E(2) falls short of a predetermined block size, E(2) is padded so as to reach the predetermined block size. Systematic bits SE(1), SE(2) and parity bits PE(1) and PE(2) are obtained by performing erasure correction coding on E(1) and E(2) which have been adjusted to the predetermined block size. Of these bits, only parity bits PE(1) and PE(2) are selected by ECC bit selection section 125.

Figure 5:
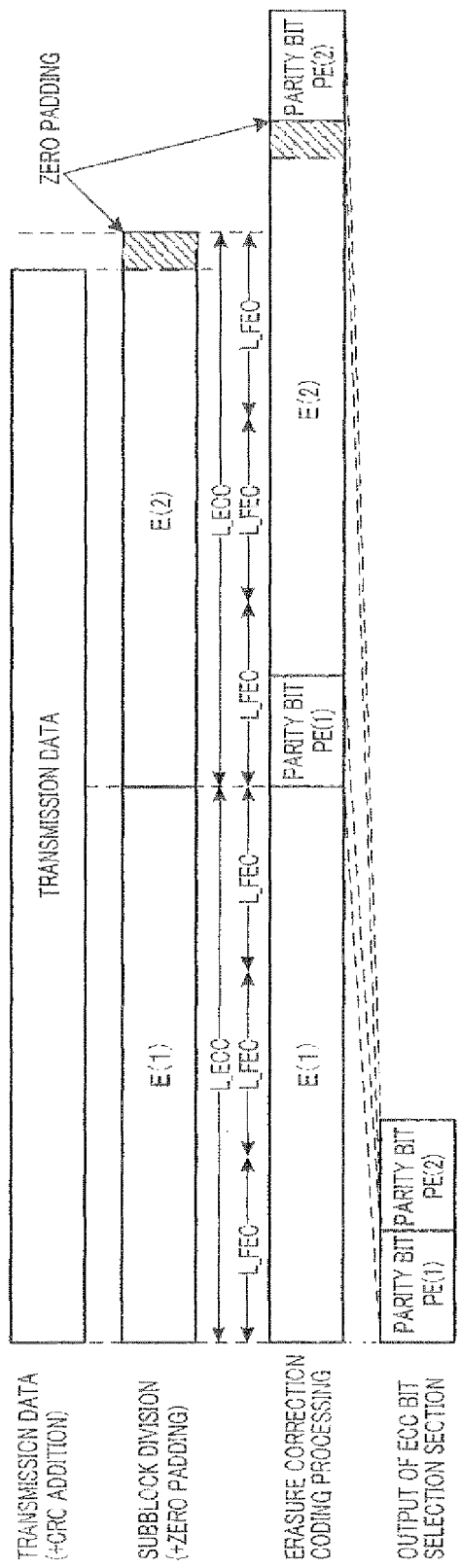
FIG. 5 is a diagram illustrating processing of the erasure correction encoding section and ECC bit selection section.

Here, the coding unit length in erasure correction encoding section 110 may be a natural-number multiple of the coding unit length in error correcting coding section 145. That is, L_ECC=FEC*n is satisfied, and n is a natural number. This makes it possible to achieve commonality of the number of bits when error correcting coding block generation section 135 performs zero padding. FIG. 5 shows a base with n=3. This makes systematic bits common between the erasure correction coding processing and error correcting coding processing. Therefore, radio terminal apparatus 200 on the receiving side can perform erasure correction decoding processing with minimum wastage using the decoding result per subblock having the L_FEC size obtained through error correcting decoding processing. Furthermore, even if erasure correction encoding section 110 does not add CRC bits to the entire transmission data, radio terminal apparatus 200 on the receiving side can easily perform error detection using CRC bits per subblock having the L_FEC size. This simplifies the decoding processing.

Figure 6:
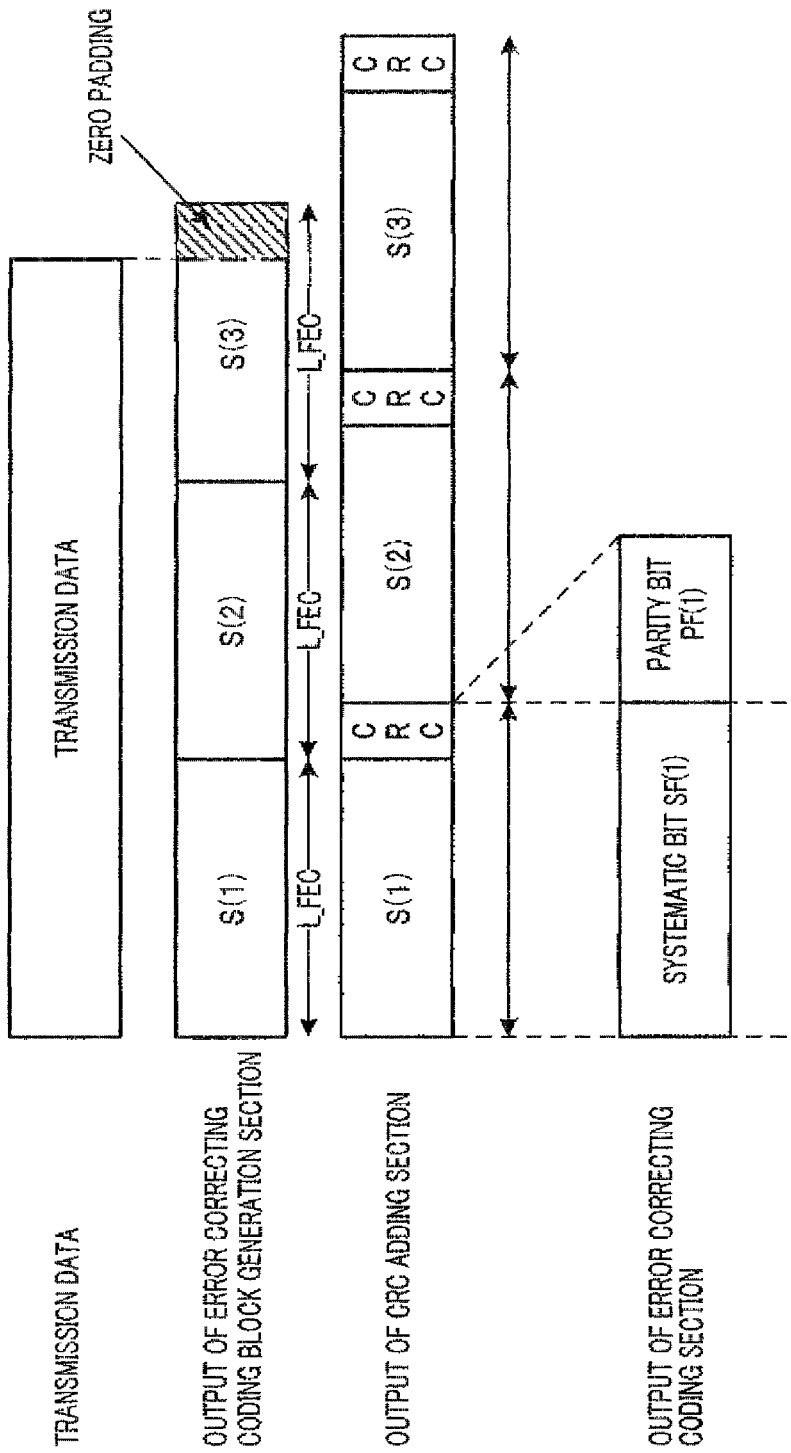
FIG. 6 is a diagram illustrating processing of the error correcting coding block generation section, CRC adding section and error correcting coding section.
Figure 7:
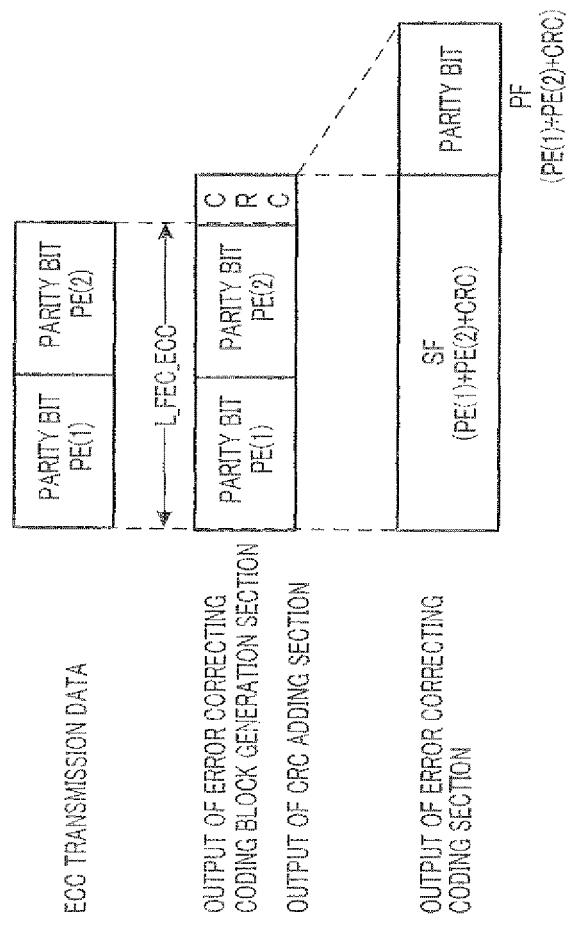
FIG. 7 is a diagram illustrating processing of the error correcting coding block generation section, CRC adding section and error correcting coding section.

FIG. 6 and FIG. 7 are diagrams illustrating processing of error correcting coding block generation section 135, CRC adding section 140 and error correcting coding section 145. FIG. 6 illustrates processing on the transmission data received from data storage section 115 and FIG. 7 illustrates processing on the ECC transmission data.

As shown in FIG. 6, the transmission data outputted from data storage section 115 is divided per L_FEC by error correcting coding block generation section 135. Here, since Jmax=3, three subblocks S(1), S(2) and S(3) are obtained. Since S(3) falls short of a predetermined block size, S(3) is padded so as to reach the predetermined block size.

CRC adding section 140 adds CRC bits to S(1), S(2) and S(3) which have been adjusted to the predetermined block size respectively. Systematic bits SF(1), SF(2) and SF(3), and parity bits PF(1), PF(2) and PF(3) are obtained by performing error correcting coding on S(1), S(2) and S(3) with CRC bits added.

Furthermore, as shown in FIG. 7, error correcting coding block generation section 135 adjusts ECC transmission data (parity bits PE(1) and PE(2)) to the size of L_FEC_ECC and CRC adding section 140 then adds CRC bits thereto.

Systematic bit SF and parity bit PF are then obtained by performing error correcting coding on the ECC transmission data with CRC bits added.

Systematic bits SF(1), SF(2) and SF(3), parity bits PF(1), PF(2) and PF(3), systematic bit SF and parity bit PF formed as described above are subjected to the above-described processing by FEC bit selection section 150 and modulation section 155. Non-ECC transmission symbol data and ECC transmission symbol are obtained in this way.

Non-ECC transmission symbol data and ECC transmission symbols are allocated to subcarriers in a predetermined OFDM symbol by subcarrier allocation section 170 based on resource allocation information. Furthermore, control information formed by control information generation section 160 is mapped to predetermined time (OFDM symbol) and frequency (subcarrier) resources by subcarrier allocation section 170.

FIG. 8 illustrates variations of resource allocation. Here, allocation information #1 represents allocation information for non-ECC symbol data. Allocation information #1 includes the position (on the frequency axis/time axis) of non-ECC symbol data, data length, MCS ((Modulation and Coding Scheme) information (information about the coding rate and the M-ary modulation value of error correcting coding section 145) and multicast identification (e.g. M-CID #1) information. Furthermore, allocation information #2 represents allocation information for ECC symbol data. Allocation information #2 includes the position (on the frequency axis/time axis) of ECC symbol data, data length, MCS information (coding rate of error correcting coding section 145 and information about the M-ary modulation value), multicast identification (e.g. M-CID #1) information, and ECC coding information (e.g. including identification information with regard to the presence/absence of ECC application, ECC coding rate information).

When the bit length of CRC bits is known, the data length included in allocation information #1 can be calculated using the number of subblocks of L_FEC and L_FEC and MCS information. Therefore, L_FEC and the number of subblocks of L_FEC may be included in allocation information #1 instead of the data length. Furthermore, when the bit length of CRC bits is known, the data length included in allocation information #2 can also be calculated using L_FEC_ECC, the number of subblocks of L_FEC_ECC and MCS information. Therefore, L_FEC_ECC and the number of subblocks of L_FEC_ECC may be included in allocation information #2 instead of the data length.

Furthermore, when the packet configuration shown in FIG. 5 is used, allocation information #2 need not include information about the coding rate in data length or erasure correction coding. Therefore, overhead can be reduced.

Figure 8A:
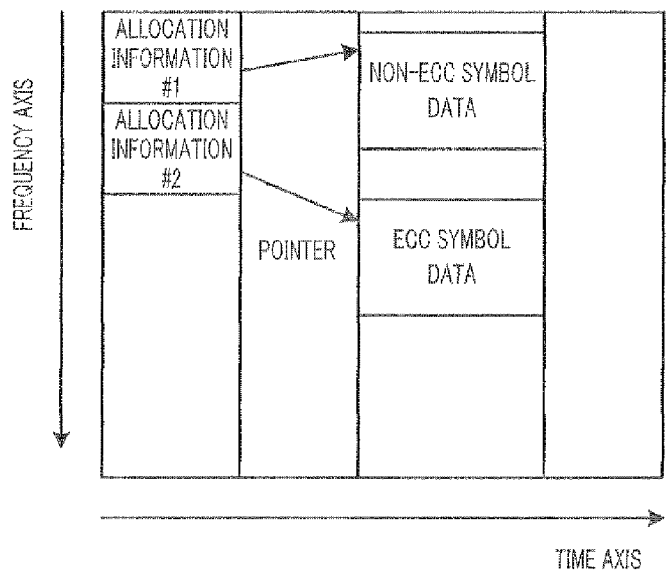
FIG. 8 is a diagram illustrating variations of resource allocation.

In FIG. 8A, non-ECC symbol data and ECC symbol data are mapped to the same OFDM symbol. By so doing, radio terminal apparatus 200 on the receiving side can perform OFDM demodulation on the non-ECC symbol data and ECC symbol data together.

Figure 8B:
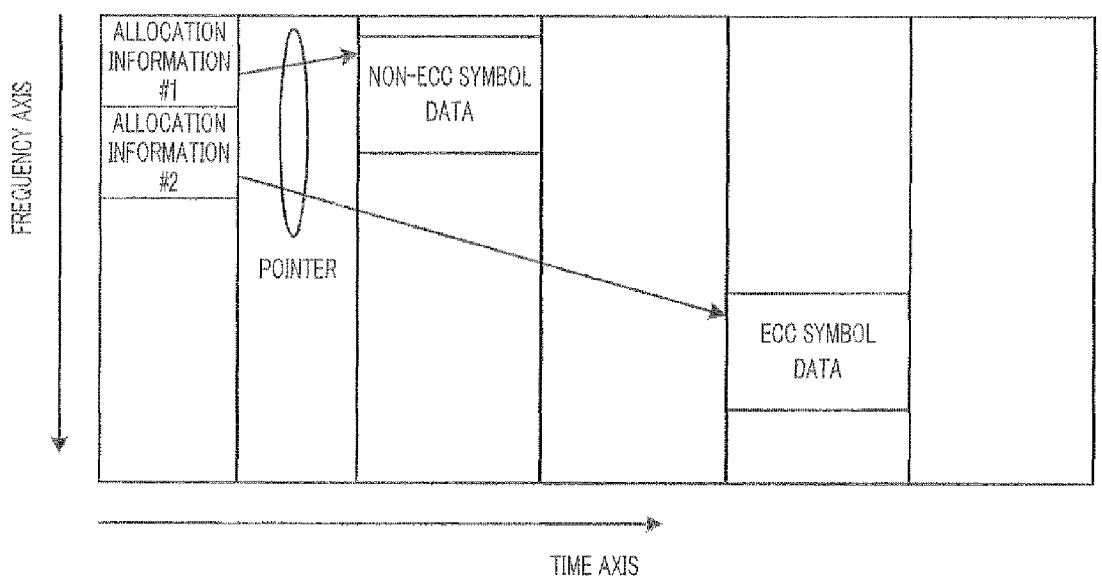

On the other hand, in FIG. 8B, ECC symbol data is mapped to an OFDM symbol that is a predetermined number of OFDM symbols apart from an OFDM symbol to which non-FCC symbol data is mapped. In this case, radio terminal apparatus 200 on the receiving side can determine whether or not ECC symbol data needs to be received based on the reception result of non-FCC symbol data sent beforehand. Therefore, when the non-ECC symbol data has been successfully received without errors, it is possible to avoid reception processing on the ECC symbol data and thereby further reduce power consumption of MS.

Here, multicast identification information (M-CID #1) for the non-ECC symbol data is made to match multicast identification information (M-CID #1) for the ECC symbol data. By so doing, it is possible to perform ECC decoding which associates the non-ECC symbol data with the ECC symbol data during decoding processing by radio terminal apparatus 200. This makes it possible to improve receiving quality with respect to transmission data.

Furthermore, the following effects can be achieved by causing multicast identification information (M-CID #1) for the non-ECC symbol data to match multicast identification information (M-CID #1) for the ECC symbol data. That is, in a radio communication system to which MBS (Multicast Broadcast Service) is applied, this allows a radio terminal apparatus (legacy terminal) capable of receiving only non-ECC symbol data to perform communication. For example, even when ECC is added as an expanded function to an MBS radio communication system to which only conventional FEC is applied, the legacy terminal can extract allocation information used for the MBS radio communication system before the function expansion and receive non-ECC symbol data based on the allocation information. Furthermore, a terminal capable of receiving ECC symbol data (that is, enhanced terminal supporting an expanded function) can receive both non-ECC symbol data and ECC symbol.

Figure 9A:
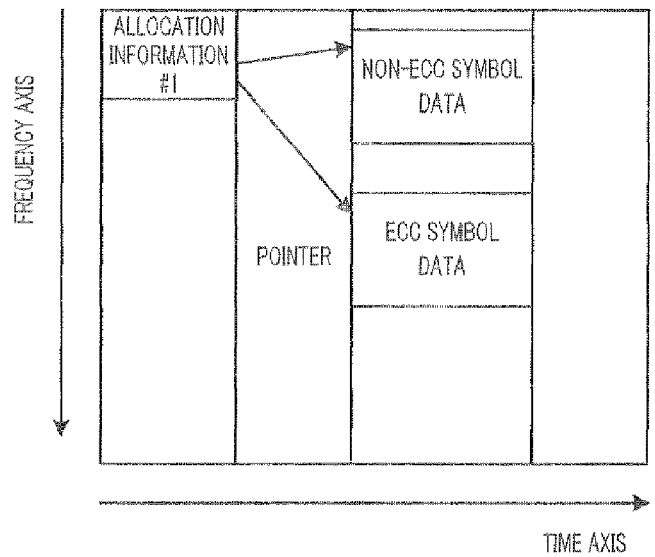
FIG. 9 is a diagram illustrating a method of associating non-ECC symbol data with ECC symbol data.
Figure 9B:
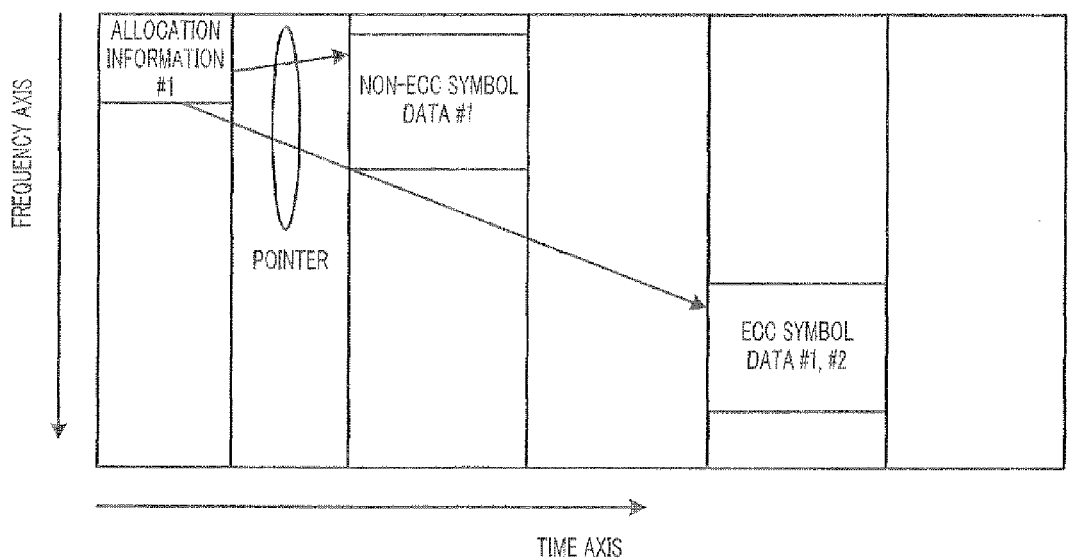

Furthermore, another method may also be used to associate non-ECC symbol data with ECC symbol data. That is, as shown in FIG. 9, a format may be adopted which includes all allocation information of non-ECC symbol data and allocation information of ECC symbol data to be associated therewith in allocation information #1. This prevents the same M-CID from being sent with allocation information #1, #2, and can thereby reduce overhead of allocation information. However, in this case, it is not possible to realize the coexistence of the aforementioned legacy terminal and enhanced terminal. In FIG. 9A, non-ECC symbol data and ECC symbol data are mapped to the same OFDM symbol. In FIG. 9B, ECC symbol data is mapped to an OFDM symbol that is a predetermined number of OFDM symbols apart from an OFDM symbol to which non-ECC symbol data is mapped.

The transmission data transmitted with resources allocated in this way is received by radio terminal apparatus 200.

Encoded signal extraction section 225 extracts non-ECC symbol data from the received signal after OFDM demodulation based on allocation information #1 extracted by control information extraction section 220. Encoded signal extraction section 230 extracts ECC symbol data from the received signal after the OFDM demodulation based on allocation information #2 extracted by control information extraction section 220.

Figure 10:
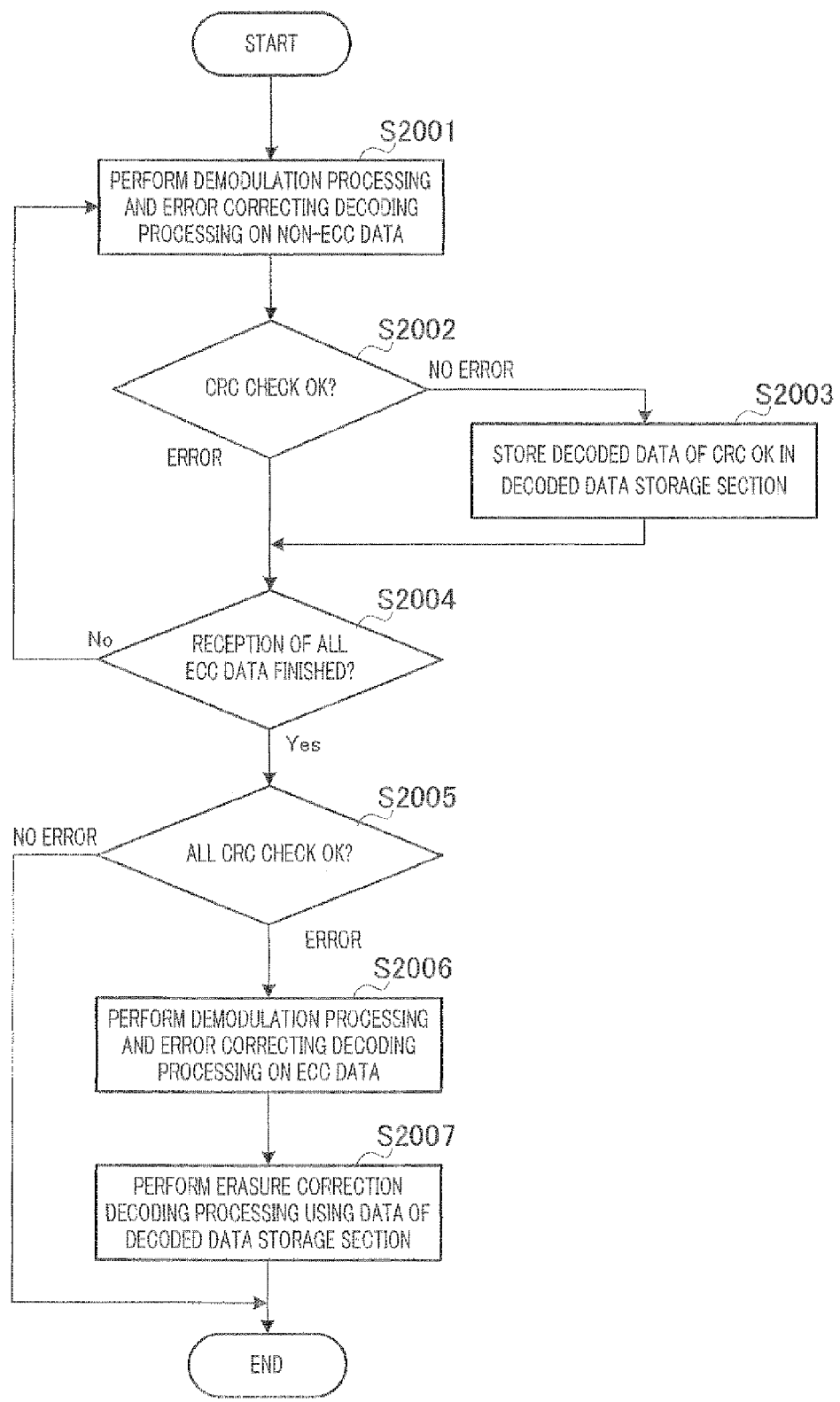
FIG. 10 is a flowchart of decoding control by the decoding control section.

FIG. 10 is a flowchart of decoding control by decoding control section 235.

Decoding control section 235 associates non-FCC symbol data with FCC symbol data having a common M-CID based on control information extracted by control information extraction section 220 and then performs the decoding control shown in FIG. 10.

Decoding control section 235 changes switch 240 to the encoded signal extraction section 225 side and causes non-ECC symbol data to be outputted from encoded signal extraction section 225. In step S2001, the non-ECC symbol data is subjected to demodulation processing and error correcting decoding processing by demodulation section 245 and error correcting decoding section 250.

In step S2002, CRC check section 255 checks whether or not there are errors in a result of error correcting decoding processing. Here, CRC check is performed per subblock. Based on the check result, subblocks not containing errors have the CRC bits removed, and stored in decoded data storage section 260 (step S2003).

The processing in steps S2001 to 2003 is repeated until the processing is performed on all subblocks included in the non-ECC symbol data in step S2004.

Figure 11A:
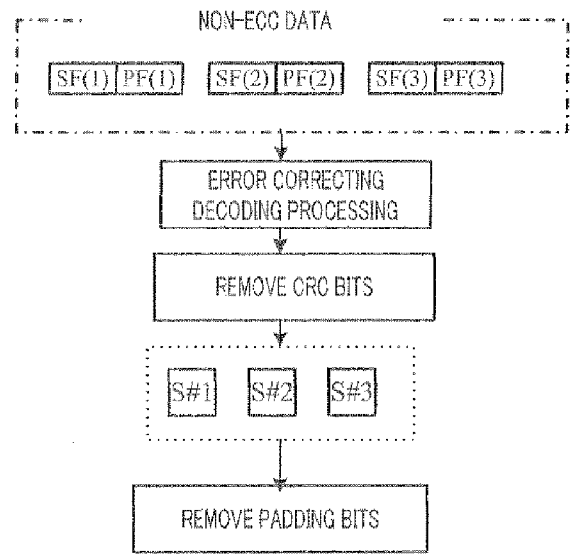

After the processing in steps S2001 to 2003 is performed on all subblocks, decoding control section 235 determines whether or not errors are detected in all subblocks in step S2005. When the decision result shows that errors are not detected in any subblocks, padding bits are removed from subblocks. Decoding processing on data transmitted from radio communication apparatus 100 is finished in this way. FIG. 11A schematically illustrates steps of decoding processing or the like when no error is detected in non-ECC symbol data. In this case, since there is no need to perform ECC decoding processing, it is possible to reduce power consumption and reduce the processing delay in radio terminal apparatus 200.

When the determination result in step S2005 shows that errors are detected in at least some subblocks, decoding control section 235 changes switch 240 to the encoded signal extraction section 230 side and causes ECC symbol data to be outputted from encoded signal extraction section 230. In step S2006, demodulation section 245 and error correcting decoding section 250 perform demodulation processing and error correcting decoding processing on the ECC symbol data.

The error-free decoding result obtained in step S2006 has the CRC bits removed, and stored in decoded data storage section 260.

Figure 11B:
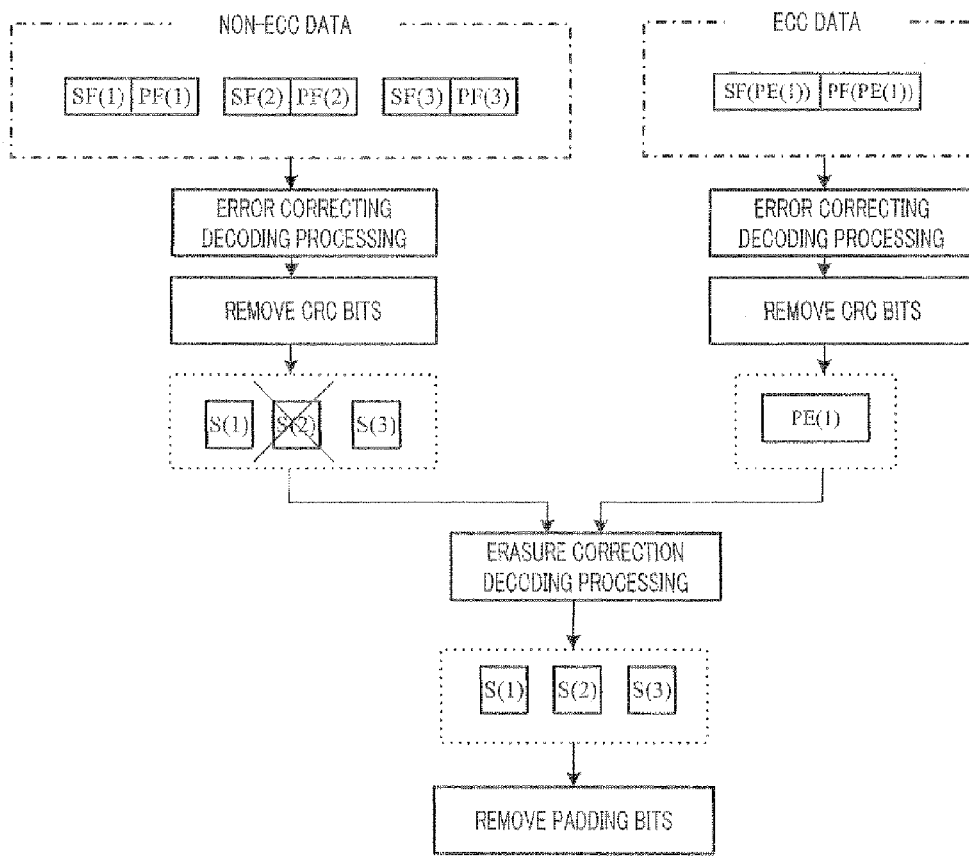

In step S2007, decoding control section 235 changes switch 265 to the erasure correction decoding section 270 side, makes decoded data storage section 260 output data thereof for erasure correction decoding processing, and makes erasure correction decoding section 270 perform erasure correction decoding. When the result of erasure correction decoding processing shows no error, padding bits are removed from the erasure correction decoding result. Decoding processing on the data transmitted from radio communication apparatus 100 is thereby finished. FIG. 11B schematically illustrates steps of decoding processing or the like when no error is detected in the non-ECC symbol data and no error is detected in the ECC symbol data.

As described above, according to the present embodiment, in radio communication apparatus 100, erasure correction encoding section 110 performs erasure correction coding (ECC) on transmission data (that is, aforementioned second transmission data), error correcting coding section 145 encodes transmission data which is duplicated transmission data (that is, aforementioned first transmission data) and ECC parity bits obtained by erasure correction encoding section 110 independently of each other according to an error correcting coding scheme other than erasure correction coding, transmitting section 165 transmits only systematic bits obtained from the first transmission data in error correcting coding section 145 as information bits and transmits the coding result obtained from the first transmission data and ECC parity bits in error correcting coding section 145 as parity bits.

By so doing, radio terminal apparatus 200 on the receiving side can perform two-step decoding processing. That is, radio terminal apparatus 200 performs error correcting decoding using the coding result obtained from information bits and second transmission data as a first step and finishes the decoding processing in this step when the transmission data has been reproduced without errors. This eliminates the necessity of performing a second step uselessly, and can thereby reduce power consumption. When errors are detected at the first step, radio terminal apparatus 200 performs, as a second step, erasure correction decoding on the error correcting decoding result obtained in the first step and the result of performing error correcting decoding on parity bits. This makes it possible to realize decoding of higher error correction performance.

Figure 1B:
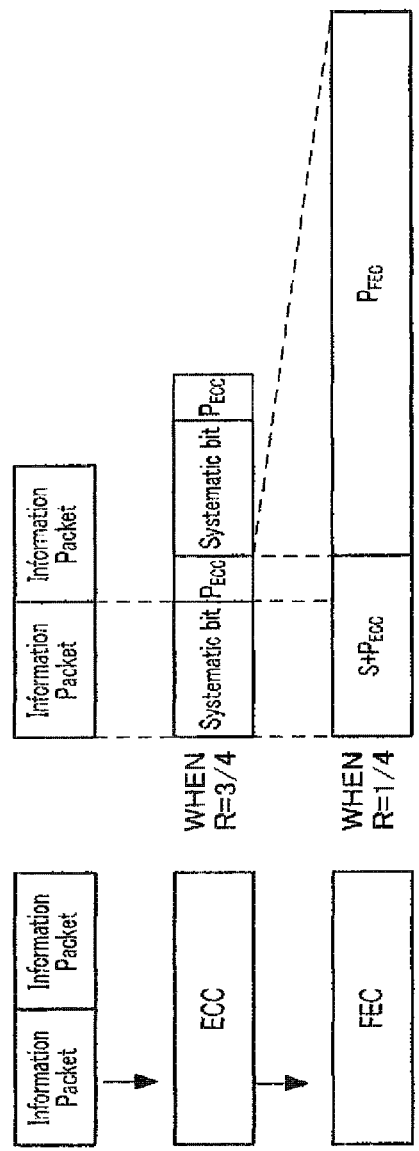

By the way, in the method using the erasure correction code (ECC) shown in FIG. 1B as outer code of FEC, the erasure correction coding (ECC) processing is linked to the error correction coding (FEC) processing. Thus, the receiving side cannot separate erasure correction encoded (ECC) transmission data (or systematic bits) from added bits (e.g. parity bits, padding bits, CRC bits, etc.). Therefore, even if the receiving side has successfully reproduced transmission data without errors in the step in which only error correcting decoding is performed, the receiving side has no means for confirming the fact and needs to perform the erasure correction decoding processing all the time. Furthermore, when convolutional code (including a case where convolutional code is used as element code) is used for coding, if the erasure correction coding (ECC) processing is linked to the error correction coding (FEC) processing, since the inner state of the shift register when coding ECC parity changes due to information bit data, and therefore the inner state thereof cannot be identified. Therefore, it is not possible to extract only encoded data which is FEC-encoded to ECC parity and perform decoding processing as in the case of the present invention. That is, this may make it impossible to individually allocate resources as non-ECC symbol data and ECC symbol data and transmit the data as in the ease of the present invention. On the other hand, the present invention makes it possible to individually allocate resources as non-ECC symbol data and ECC symbol data. It is thereby possible to control ON/OFF decoding processing on ECC symbols according to a receiving condition of the radio terminal apparatus and thereby reduce power consumption of the radio terminal apparatus.

Furthermore, regarding information bits, only systematic bits obtained from the first transmission data are transmitted without transmitting systematic bits obtained from the second transmission data, and it is thereby possible to reduce the amount of transmission data.

That is, both erasure correction encoding section 110 and error correcting coding section 145 use systematic codes, and thereby share systematic bits. Thus, even when ECC bit selection section 125 selects only parity bits, the receiving side can perform erasure correction decoding. This prevents overlapping systematic bits from being sent and can reduce the amount of information.

Erasure correction encoding section 110 and error correcting coding section 145 can likewise use non-systematic codes. In such a case, ECC bit selection section 125 performs puncturing on the entire encoded bit data outputted from erasure correction encoding section 110 so that a predetermined coding rate is obtained. Thus, the present invention is likewise applicable. However, since the effect of sharing systematic bits is not obtained compared to a case where both erasure correction encoding section 110 and error correcting coding section 145 use systematic codes, the number of bits selected by ECC bit selection section 125 increases even at the same coding rate.

When erasure correction coding is performed at a relatively high rate, FCC data has a smaller amount of information than that of non-ECC data. Thus, radio communication apparatus 100 may transmit ECC transmission symbols using a transmission scheme whereby higher receiving quality than that of non-ECC transmission symbols is obtained. For example, ECC transmission symbols may be transmitted using MCS whereby higher receiving quality is achieved or transmission diversity. In this case, the transmitting side can prevent resources necessary for ECC transmission symbols from significantly increasing. Furthermore, the receiving side can receive ECC data without errors and improve the coding gain obtained through erasure correction decoding processing.

A case has been described above where ECC is adopted as the first encoding method and FEC is adopted as the second coding scheme. However, the present invention is not limited to this. In short, all that has to be done is to encode transmission data using the first encoding method to form first encoded transmission data, encode the transmission data and the first encoded transmission data using the second encoding method to form second encoded transmission data, transmit the second encoded transmission data and ensure that coding using the second encoding method is performed on the transmission data and the first encoded transmission data separately. This allows the receiving side to perform two-step decoding processing, making it possible to reduce power consumption on the receiving side according to the receiving condition while maintaining advantages of the first coding scheme.

Embodiment 2

In Embodiment 2, coding rates in erasure correction coding and error correcting coding are set based on cell size. Since a radio communication apparatus according to Embodiment 2 has a basic configuration similar to that of radio communication apparatus 100, this will be described using FIG. 2.

As described in Embodiment 1, ECC bit selection section 125 and FEC bit selection section 150 can change their respective coding rates in erasure correction coding and error correcting coding based on commands of transmission scheduler 105. This makes it possible to set coding rates in erasure correction coding and error correcting coding taking the cell configuration such as cell size into account.

That is, making the coding rate in error correcting coding relatively small leads to an increase in the amount of resources to which FEC transmission data is allocated, but on the other hand, this increases a probability of securing receiving quality without the radio terminal apparatus on the receiving side performing erasure correction decoding (that is, by only decoding non-ECC data).

On the other hand, making the coding rate in error correcting coding relatively large leads to an increase in the amount of resources to which FEC transmission data is allocated, but on the other hand, this decreases a probability of securing receiving quality with only non-ECC data in the radio terminal apparatus on the receiving side, increasing the proportion of radio terminal apparatuses whose receiving quality is secured only after using ECC data together.

Here, when the cell size of radio communication apparatus 100 is small, positively using the first technique (that is, technique of making the coding rate in error correcting coding relatively small) can be favorable in both aspects of consumption of resources and power consumption of the radio terminal apparatus on the receiving side. On the other hand, when the cell size of radio communication apparatus 100 is large, setting the coding rates in erasure correction coding and error correcting coding on the assumption that non-ECC data and ECC data are used concurrently can suppress considerable consumption of resources.

Figure 12:
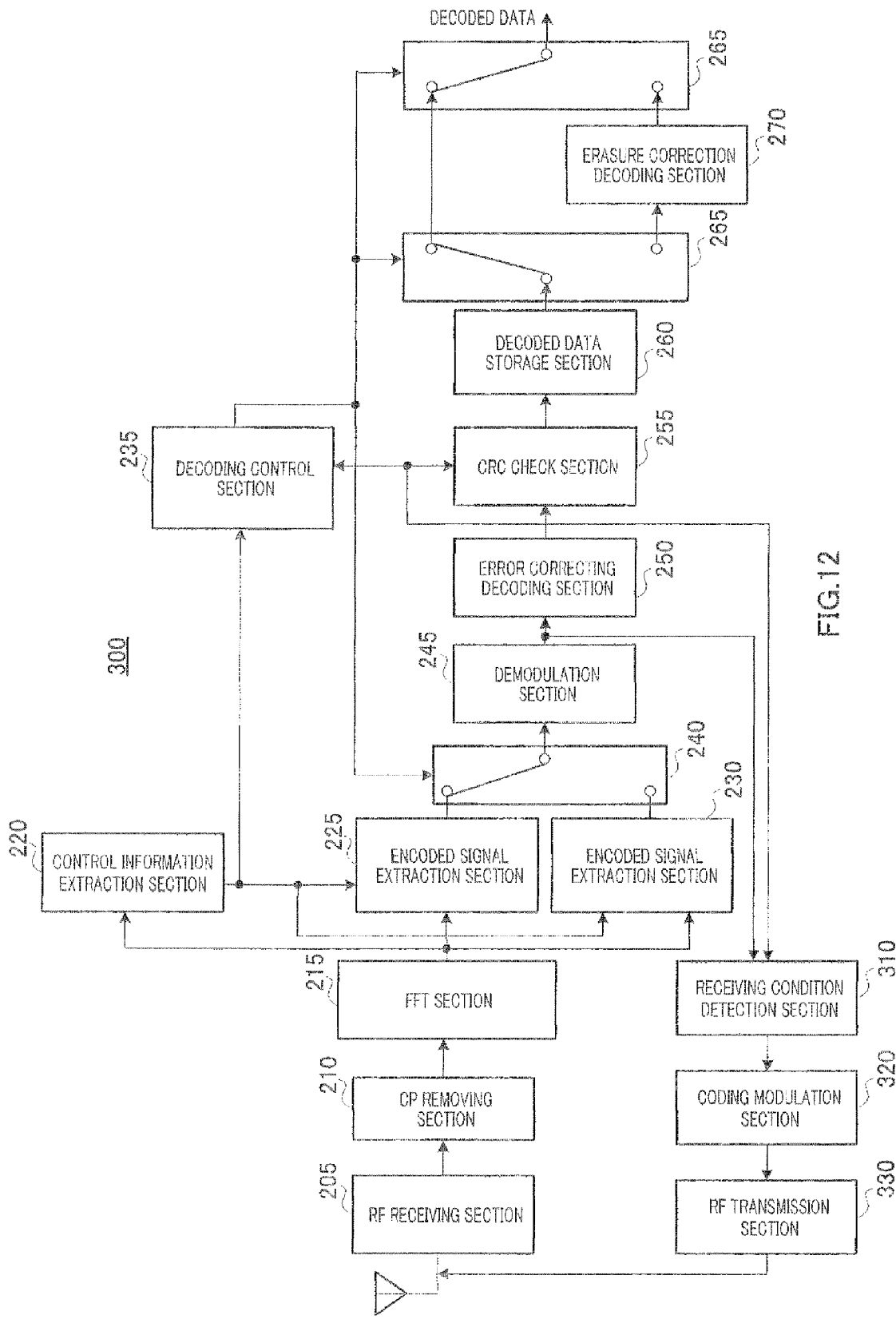
FIG. 12 is a block diagram illustrating a configuration of a radio terminal apparatus according to Embodiment 2 of the present invention.

Here, radio communication apparatus 100 which is a base station may store the cell size of radio communication apparatus 100, but may also decide the cell size of radio communication apparatus 100 based on feedback information from the radio terminal apparatus on the receiving side. FIG. 12 is a block diagram illustrating a configuration of radio terminal apparatus 300.

In FIG. 12, radio terminal apparatus 300 includes receiving condition detection section 310, coding modulation section 320 and RF transmission section 330.

Receiving condition detection section 310 detects the receiving condition based on an output signal of demodulation section 245 or an output signal of CRC check section 255. To be more specific, receiving condition detection section 310 detects an SNR with respect to MBS data from the output signal of demodulation section 245. Furthermore, receiving condition detection section 310 also detects a packet error rate or coding block error rate based on the output signal of CRC check section 255.

Receiving condition detection section 310 then forms receiving quality information including the detection result. The receiving quality information is transmitted via coding modulation section 320 and RF transmission section 330.

When there are many radio terminal apparatuses that feed back receiving quality information indicating that their receiving qualities are poor, radio communication apparatus 100 assumes that the cell size of radio communication apparatus 100 is large. Radio communication apparatus 100 then sets the coding rates in erasure correction coding and error correcting coding on the assumption that non-ECC data and ECC data are used concurrently, and can thereby suppress considerable resource consumption.

On the other hand, when there are fewer radio terminal apparatuses that feed back receiving quality information indicating that their receiving qualities are poor, radio communication apparatus 100 assumes that the cell size of radio communication apparatus 100 is small. Radio communication apparatus 100 then uses the level of coding rate that allows receiving quality to be secured with only non-ECC data, and can thereby increase a probability that many radio terminal apparatuses 300 can secure receiving quality with only non-ECC data while preventing the amount of resources to which EC transmission data is allocated from increasing.

Embodiment 3

Embodiment 3 will switch between a mode in which ECC transmission data is transmitted (hereinafter also referred to as "ECC mode") and a mode in which ECC transmission data is not transmitted (hereinafter also referred to as "FEC mode").

Figure 13:
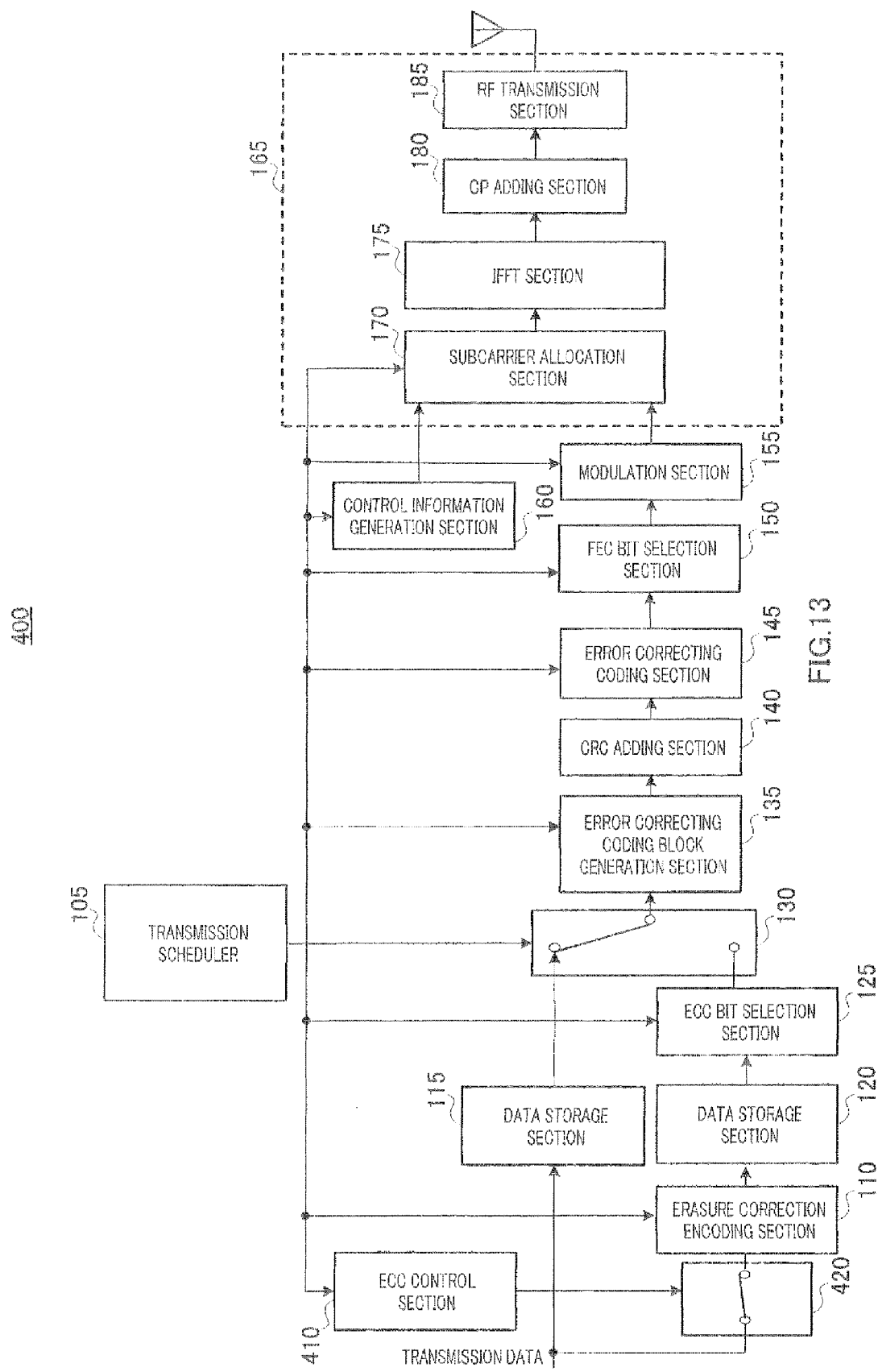
FIG. 13 is a block diagram illustrating a configuration of a radio communication apparatus according to Embodiment 3 of the present invention.

FIG. 13 is a block diagram illustrating a configuration of radio communication apparatus 400 according to Embodiment 3. As shown in FIG. 13, radio communication apparatus 400 includes ECC control section 410 and ECC operation switching section 420.

ECC control section 410 compares the size of transmission data (that is, bit length of transmission data) with predetermined size Lw and switches between ECC mode and FEC mode based on the comparison result. This switching is performed by ECC control section 410 sending an ON/OFF switching signal to ECC operation switching section 420.

To be more specific, when transmission data size Ld is smaller than predetermined size Lw (Ld<Lw), ECC control section 410 switches to FEC mode. That is, ECC control section 410 sends an OFF signal to ECC operation switching section 420.

On the other hand, when Ld≥Lw, ECC control section 410 sends an ON signal to ECC operation switching section 420 and thereby switches to ECC mode. In ECC mode, radio communication apparatus 400 operates in the same way as radio communication apparatus 100 of Embodiment 1.

ECC operation switching section 420 is set ON/OFF based on the ON/OFF switching signal received from ECC control section 410. When ECC operation switching section 420 is set to ON, transmission data is inputted to erasure correction encoding section 110. Therefore, in ECC mode, ECC transmission data in addition to the FEC transmission data is transmitted from radio communication apparatus 400. On the other hand, when ECC operation switching section 420 is set to OFF, the transmission data is not inputted to erasure correction encoding section 110. Therefore, in FEC mode, only the FEC transmission data is transmitted from radio communication apparatus 400.

Furthermore, the following control can be performed in FEC mode. That is, since transmission scheduler 105 does not transmit ECC transmission data, time and frequency resources regarding ECC transmission data are not allocated. Furthermore, control information generation section 160 does not generate control information based on the allocation information regarding the ECC transmission data. Furthermore, error correcting coding block generation section 135, CRC adding section 140, error correcting coding section 145, FEC bit selection section 150 and modulation section 155 do not operate on the ECC transmission data.

As described above, according to the present embodiment, it is possible to adaptively switch between ECC mode and FEC mode according to the size of transmission data. When a sufficient effect of ECC mode cannot be achieved (that is, when the transmission data size is small), this allows the mode to switch to FEC mode and thereby eliminates the necessity of carrying out processing which is particularly performed in ECC mode. Therefore, power consumption of radio communication apparatus 400 can be reduced. Furthermore, since the radio terminal apparatus on the receiving side need not perform ECC decoding operation, either, it is possible to reduce power consumption.

As the criterion to switch between ECC mode and FEC mode, the magnitude relationship between predetermined value Lk and L_ECC/L_FEC may be used instead of the magnitude relationship between predetermined size Lw and transmission data size Ld. In this case, a numerical value obtained by normalizing a bit length for performing erasure correction coding with a bit length for performing error correcting coding is compared with predetermined value Lk and it is thereby possible to perform more accurate mode switching.

Embodiment 4

Embodiment 4 will adjust the criterion to switch between ECC mode and FEC mode according to a QoS requirement of MBS data.

Figure 14:
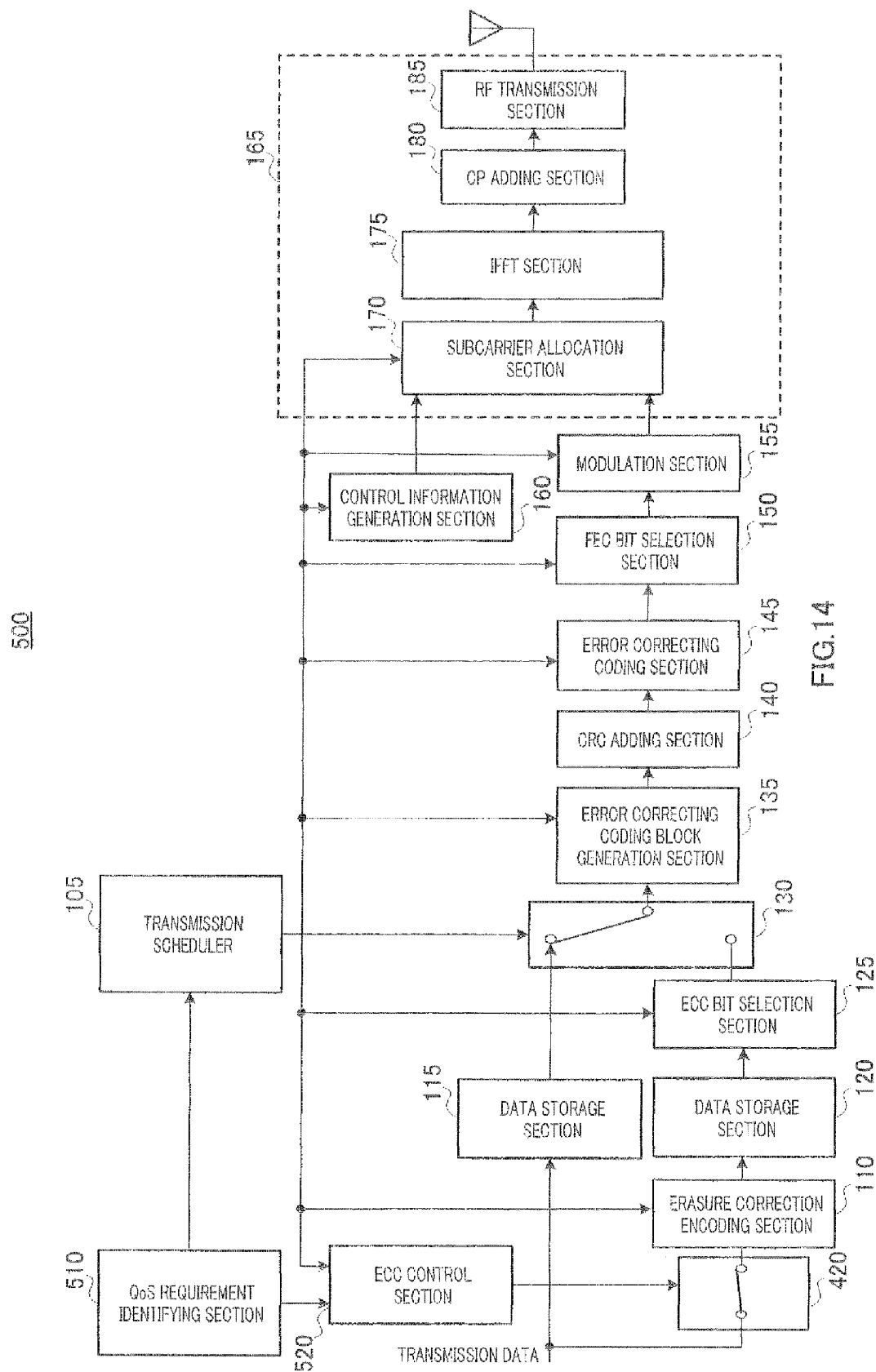
FIG. 14 is a block diagram illustrating a configuration of a radio communication apparatus according to Embodiment 4 of the present invention.

FIG. 14 is a block diagram illustrating a configuration of radio communication apparatus 500 according to Embodiment 4. In FIG. 14, radio communication apparatus 500 includes QoS requirement identifying section 510 and ECC control section 520.

QoS requirement identifying section 510 identifies the QoS of which MBS data to be transmitted is required, and sends the identified QoS requirement to ECC control section 520.

ECC control section 520 adjusts the criterion to switch between ECC mode and FEC mode based on the QoS requirement. That is, ECC control section 520 adjusts a threshold (that is, predetermined size Lw, predetermined value Lk) based on the QoS requirement. When MBS data is data that allows little delay, such as real-time data, ECC control section 520 adds an offset value for reducing Lw or adds an offset value for reducing Lk. This makes the condition to switch to FEC mode stricter and positively using ECC can secure receiving quality of MBS.

Embodiment 5

When the size of transmission data alone is not equal to or greater than a predetermined reference value, Embodiment 5 will combine a plurality of pieces of transmission data before erasure correction coding processing and assume the combined transmission data to be a target of erasure correction coding.

Figure 15:
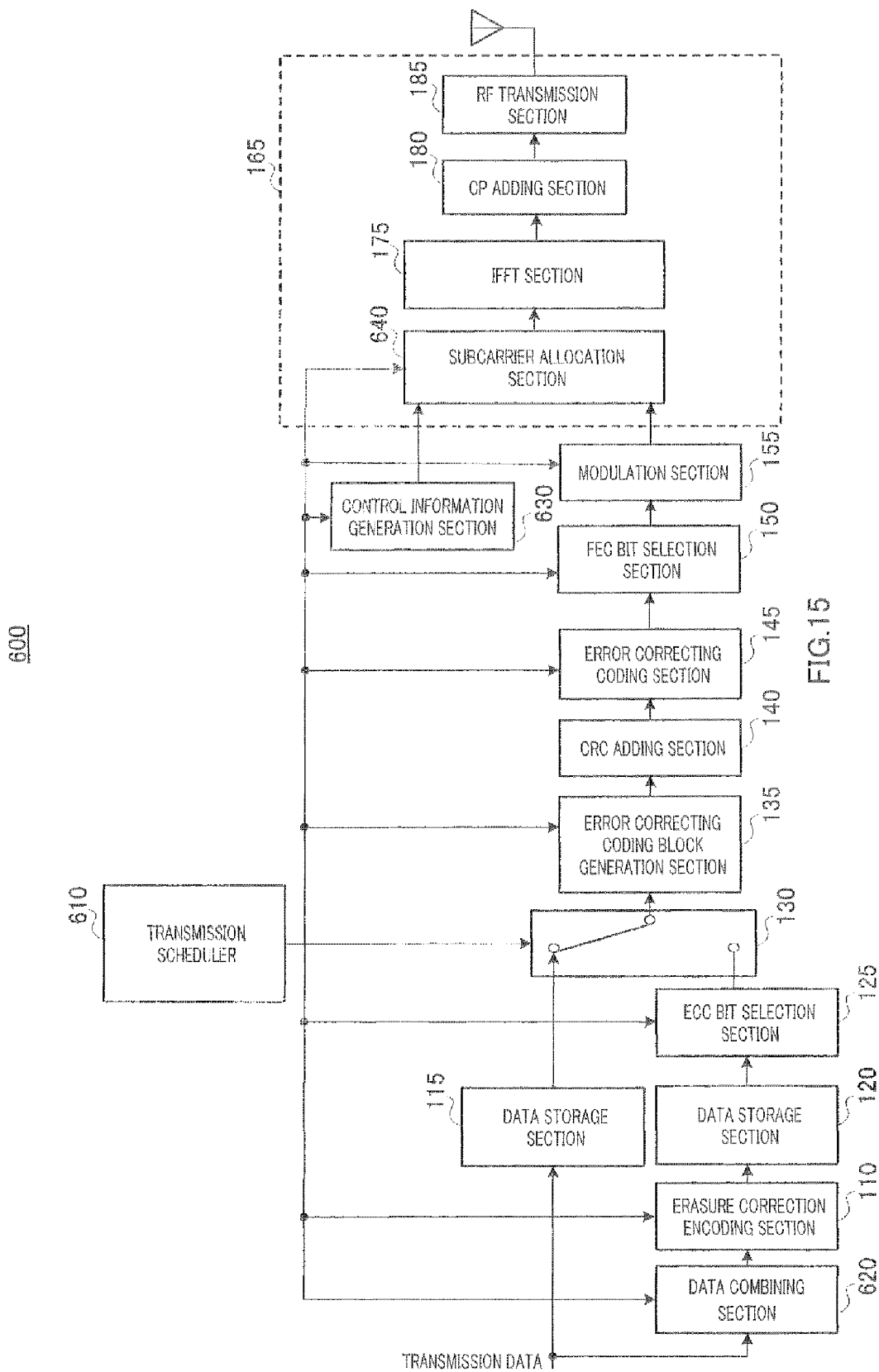
FIG. 15 is a block diagram illustrating a configuration of a radio communication apparatus according to Embodiment 5 of the present invention.

FIG. 15 is a block diagram illustrating a configuration of radio communication apparatus 600 according to Embodiment 5. In FIG. 15, radio communication apparatus 600 includes transmission scheduler 610, data combining section 620, control information generation section 630 and subcarrier allocation section 640.

Transmission scheduler 610 allocates time and frequency resources to transmission data. Furthermore, transmission scheduler 610 determines a coding rate, M-ary modulation value, coding block length (or information bit size) and transmission data size used in allocated resources.

Furthermore, when transmission data inputted to erasure correction encoding section 110 satisfies condition (1) or (2) below, transmission scheduler 610 controls data combining section 620 so as to combine a plurality of transmission data packets.

(1) When transmission data size Ld is smaller than predetermined size Lw (Ld<Lw)

(2) Ld<L_ECC=L_FEC*predetermined value Lk

When condition (1) or (2) is satisfied, transmission scheduler 610 outputs data combining command information to data combining section 620.

Data combining section 620 combines a plurality of packets made up of predetermined transmission data according to an command of transmission scheduler 610.

Figure 16:
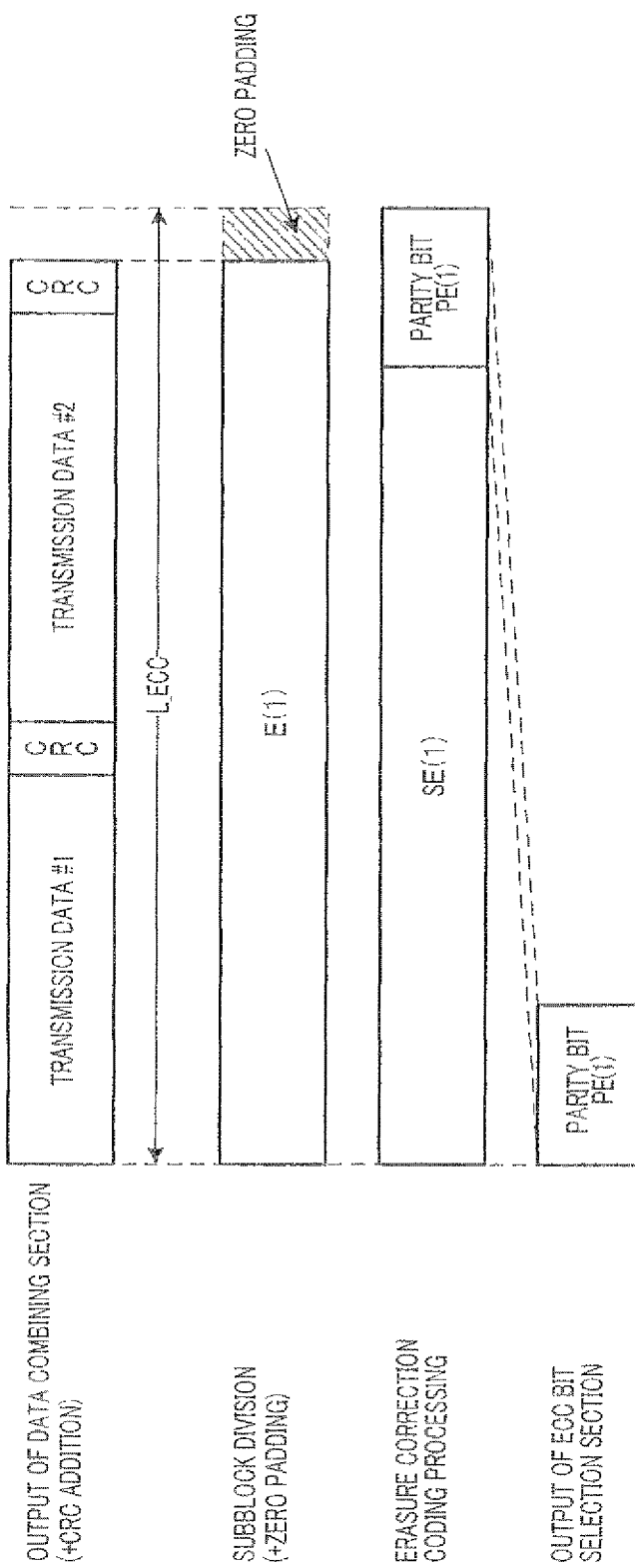
FIG. 16 is a diagram illustrating processing of the data combining section, erasure correction encoding section and ECC bit selection section.

FIG. 16 is a diagram illustrating processing of data combining section 620, erasure correction encoding section 110 and ECC bit selection section 125. FIG. 16 shows a case where CRC bits are added to each transmission data packet in data combining section 620.

As shown in FIG. 16, since the data size of transmission data #1 is less than L_ECC data combining section 620 combines transmission data #1 and transmission data #2. Here, although two transmission data packets are combined, the number of packets to combine is not limited to this.

As described in Embodiment 1, erasure correction encoding section 110 divides combined transmission data into portions of a predetermined size before performing erasure correction coding processing and performs zero padding when the data size falls short of a predetermined block size. In FIG. 16, since division processing is not performed, zero padding is applied to combined transmission data E(1).

Erasure correction encoding section 110 performs erasure correction coding on the erasure correction coding unit obtained in this way and obtains systematic bit SE(k) and parity bit PE(k) in consequence. Systematic bit SE(k) and parity bit PE(k) are inputted to ECC bit selection section 125 via data storage section 120. The erasure correction coding processing in Embodiment 5 will be described in detail later.

Of systematic bit SE(k) and parity bit PE(k) received from erasure correction encoding section 110, ECC bit selection section 125 selects only parity bits.

Figure 17:
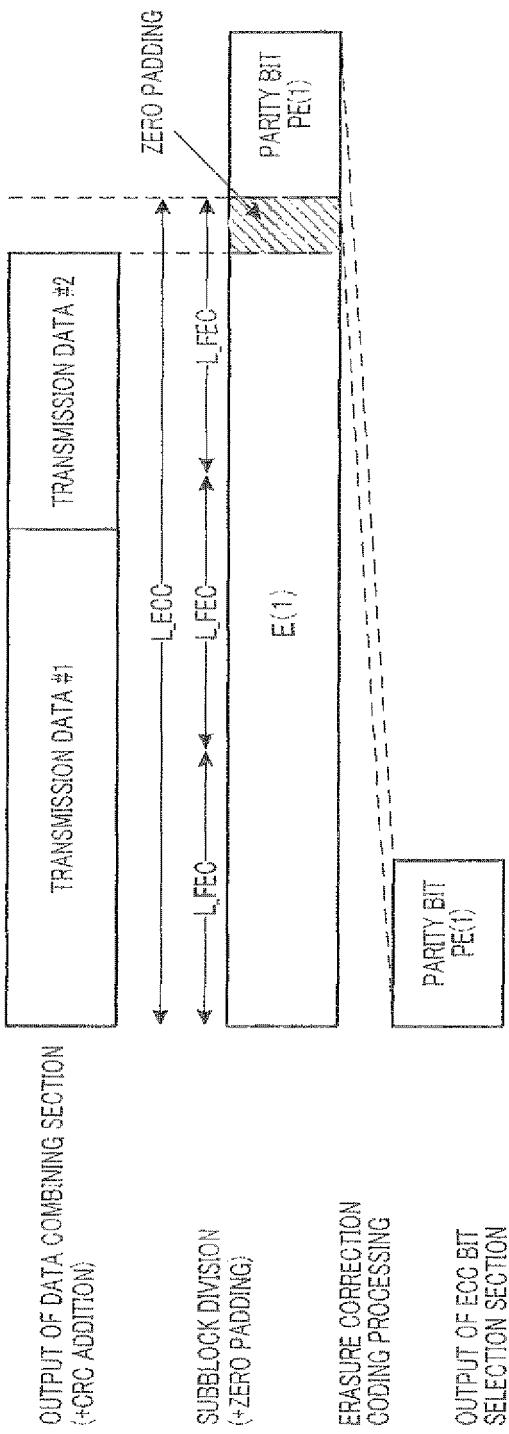
FIG. 17 is a diagram illustrating processing of the data combining section, erasure correction encoding section and ECC bit selection section.

FIG. 17 is a diagram illustrating processing of data combining section 620, erasure correction encoding section 110 and ECC bit selection section 125. FIG. 17 particularly shows a case where the coding unit length in erasure correction encoding section 110 is a natural-number multiple of the coding unit length in error correcting coding section 145.

As shown in FIG. 17, since transmission data #1 satisfies condition (2) above, data combining section 620 combines transmission data #1 and transmission data #2. Here, two transmission data packets are combined, but the number of packets to combine is not limited to this. Here, unlike FIG. 16, transmission data are combined without CRC bits being added. The subsequent processing shown in FIG. 17 is similar to the processing described in FIG. 16.

Returning to FIG. 15, control information generation section 630 and subcarrier allocation section 640 basically have functions similar to those of control information generation section 160 and subcarrier allocation section 170 described in Embodiment 1.

Control information generation section 630 generates control information to report resource allocation information received from transmission scheduler 610 to the radio terminal apparatus. Here, as described above, Embodiment 5 combines a plurality of pieces of transmission data before erasure correction coding processing. Therefore, control information generation section 630 may individually handle allocation information of each piece of transmission data included in the combined transmission data as shown in FIG. 18A or put them together into one piece of allocation information as shown in FIG. 18B.

As shown in FIG. 18A, allocation information #1 corresponding to non-ECC transmission symbol data #1 includes the position (on the frequency axis/time axis), data length, MCS information, multicast identification (e.g. M-CID #1) information of non-ECC symbol data. Allocation information #2 corresponding to non-FCC transmission data #2 includes the position (on the frequency axis/time axis), data length, MCS information, multicast identification (e.g. M-CID #2) information of non-ECC symbol data. However, when allocation information #1 and allocation information #2 overlap each other, the overlapping pieces of information may be grouped into one piece of allocation information as shown in FIG. 18B. By so doing, control information overhead can be reduced.

Subcarrier allocation section 640 allocates no ECC transmission symbol data and ECC transmission symbol data to subcarriers in a predetermined OFDM symbol based on the resource allocation information received from transmission scheduler 610. Furthermore, subcarrier allocation section 640 receives control information from control information generation section 630 and maps the control information to predetermined time (OFDM symbol) and frequency (subcarrier) resources.

FIG. 19 illustrates variations of resource allocation. Here, allocation information #1 represents allocation information corresponding to non-ECC symbol 1 data #1 obtained from transmission data #1. Allocation information #2 represents allocation information corresponding to non-ECC symbol data #2 obtained from transmission data #2. Allocation information #3 represents allocation information corresponding to ECC symbol data #1 and #2 obtained from combined transmission data of transmission data #1 and transmission data #2.

Figure 19A:
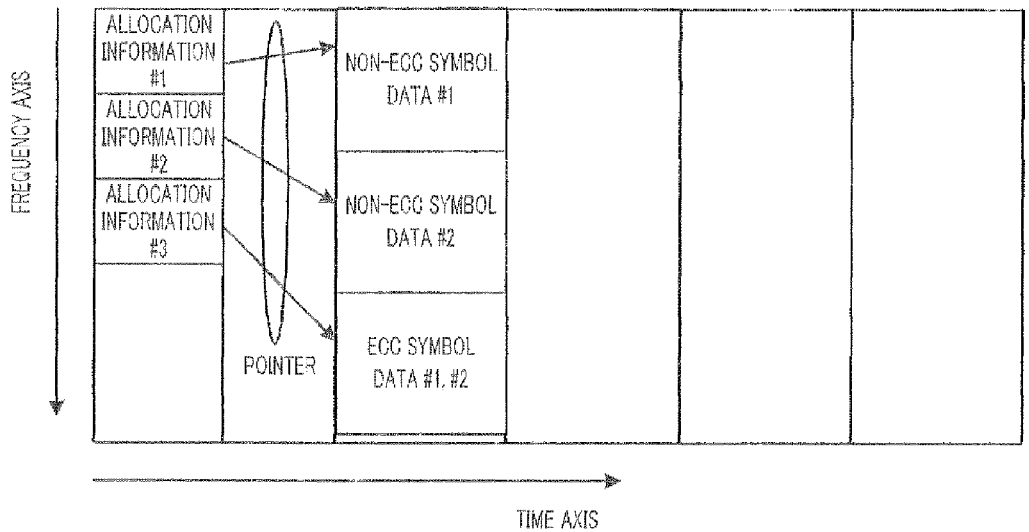
FIG. 19 is a diagram illustrating variations of resource allocation.

In FIG. 19A, non-ECC symbol data and ECC symbol data are mapped to the same OFDM symbol. By so doing, the radio terminal apparatus on the receiving side can perform OFDM demodulation on the non-ECC symbol data and ECC symbol data together.

Figure 19B:
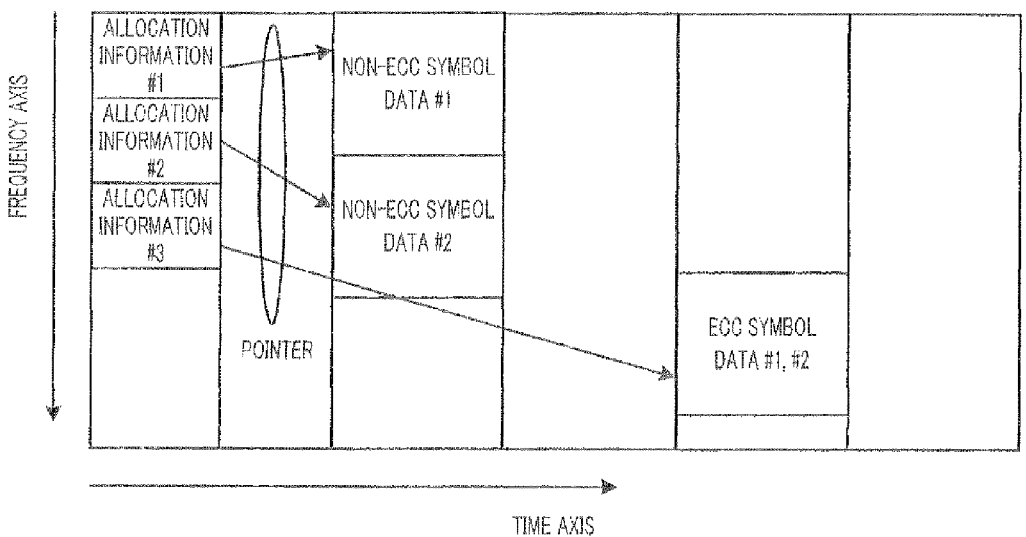

On the other hand, in FIG. 19B, ECC symbol data is mapped to an OFDM symbol that is a predetermined number of OFDM symbols apart from an OFDM symbol to which non-FCC symbol data is mapped. In this case, the radio terminal apparatus on the receiving side can determine whether or not the ECC symbol data needs to be received based on the reception result of non-ECC symbol data sent beforehand. Therefore, when the non-ECC symbol data has been successfully received without errors, the ECC symbol data is not subjected to reception processing and power consumption of MS can thereby be reduced further.

Here, allocation information #3 (that is, allocation information corresponding to ECC symbol data obtained from combined transmission data) includes all multicast identification information used when the non-ECC symbol data obtained from the respective component transmission data included in the combined transmission data is allocated to resources. That is, since allocation information #3 is allocation information corresponding to ECC symbol data #1 and #2 obtained from the respective combined transmission data of transmission data #1 and transmission data #2, allocation information #3 includes both multicast identification information (M-CID #1) corresponding to transmission data #1 and multicast identification information (M-CID #2) corresponding to transmission data #2.

During decoding processing in the radio terminal apparatus on the receiving side, this allows ECC decoding that associates the non-ECC symbol data with the ECC symbol data. It is thereby possible to improve receiving quality with respect to transmission data.

Next, details of the erasure correction coding processing by erasure correction encoding section 110 of the present embodiment will be described. However, the erasure correction coding processing by erasure correction encoding section 110 is not limited to that which will be described below.

Erasure correction encoding section 110 calculates an exclusive OR between each coding base unit included in subblock E(k) and another coding base unit and assumes the calculation result as ECC parity data PE(j). That is, erasure correction encoding section 110 calculates PE(j)=[SF(k) EOR SF(m)]. Here, SF(k) and SF(m) are base units of coding included in subblock E(k). The coding base unit may be referred to as "coding information bits" later.

Figure 20:
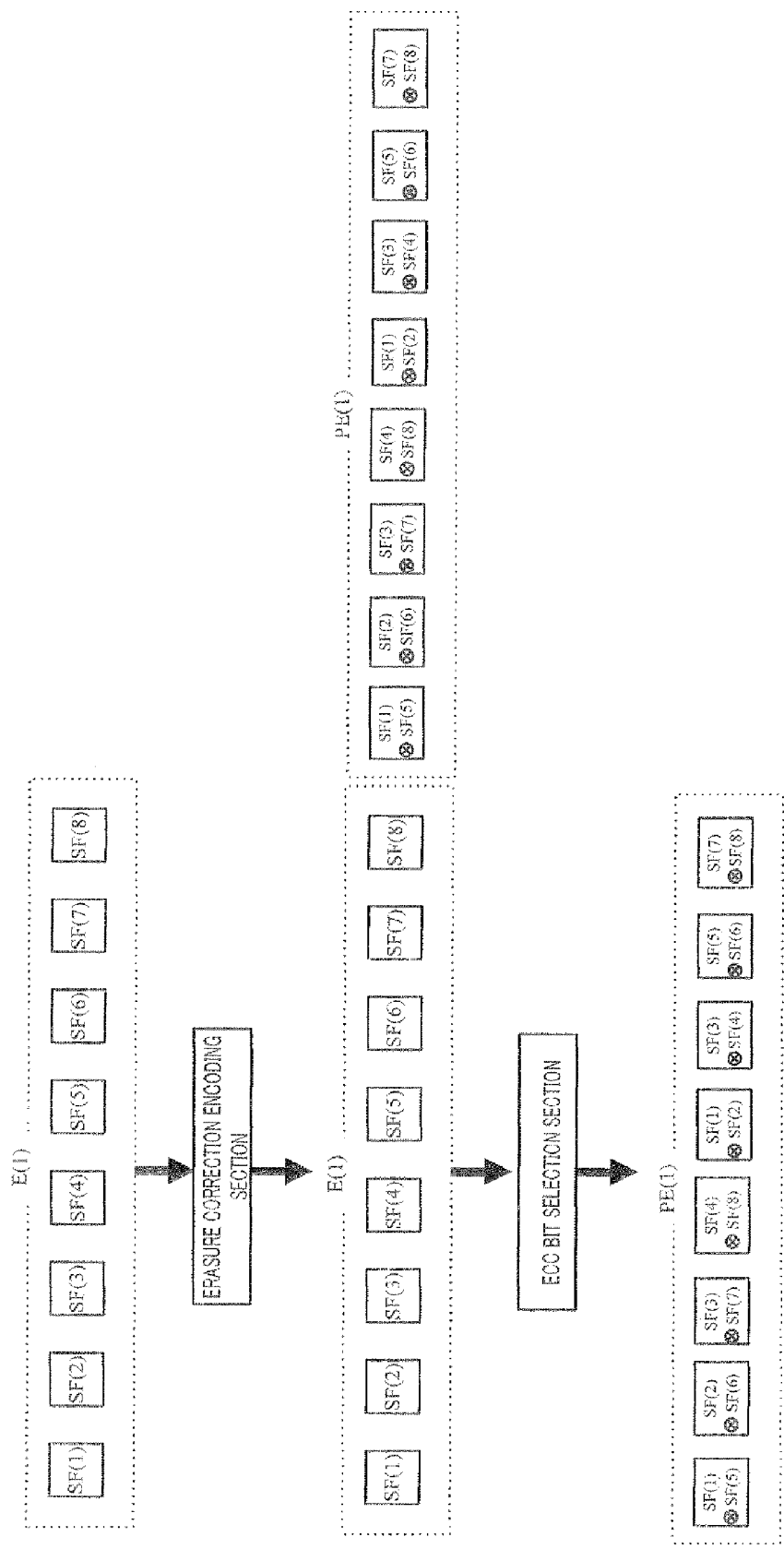
FIG. 20 is a diagram illustrating processing of the erasure correction encoding section and ECC bit selection section.

FIG. 20 is a diagram illustrating processing of erasure correction encoding section 110 and ECC bit selection section 125.

As shown in FIG. 20, the above-described exclusive OR calculation is performed on subblock E(1) made up of coding information bits SF(1), . . . , SF(8). As a result, parity bit PE(1)=[SF(1) EOR SF(5)] [SF(2) FOR SF(6)] [SF(3) EOR SF(7)] [SF(4) EOR SF(8)] [SF(1) EOR SF(2)] [SF(3) EOR SF(4)] [SF(5) EOR SF(6)] [SF(7) EOR SF(8)] is obtained.

Here, exclusive OR is never calculated between elements of the same pair in one subblock. Furthermore, in a pair of exclusive OR, k is never equal to m.

ECC bit selection section 125 only selects parity bit PE(1) of systematic bit E(1) and parity bit PE(1).

FIG. 21 is a diagram illustrating decoding processing by the radio terminal apparatus on the receiving side. Since the basic configuration of the radio terminal apparatus according to the present embodiment is similar to the configuration of radio terminal apparatus 200 according to Embodiment 1, the radio terminal apparatus according to the present embodiment will be described using FIG. 3.

Figure 21A:
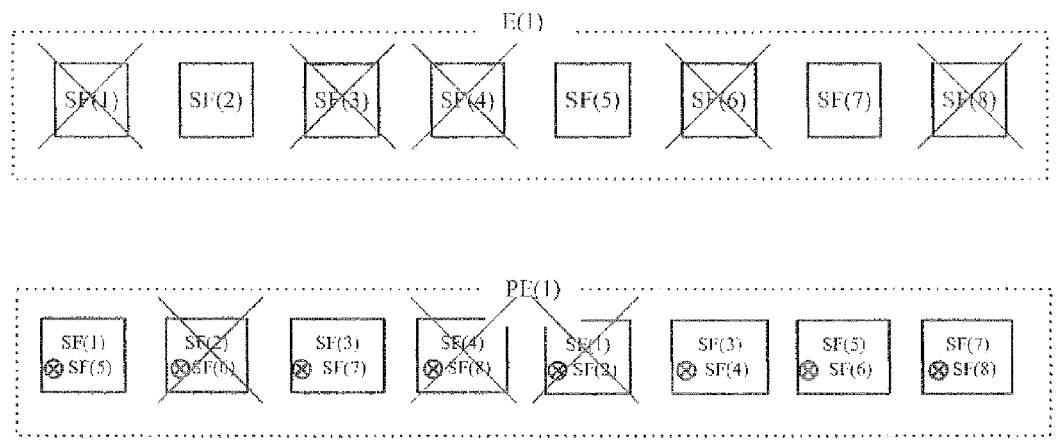
FIG. 21 is a diagram illustrating decoding processing of the radio terminal apparatus on the receiving side.
Figure 21B:
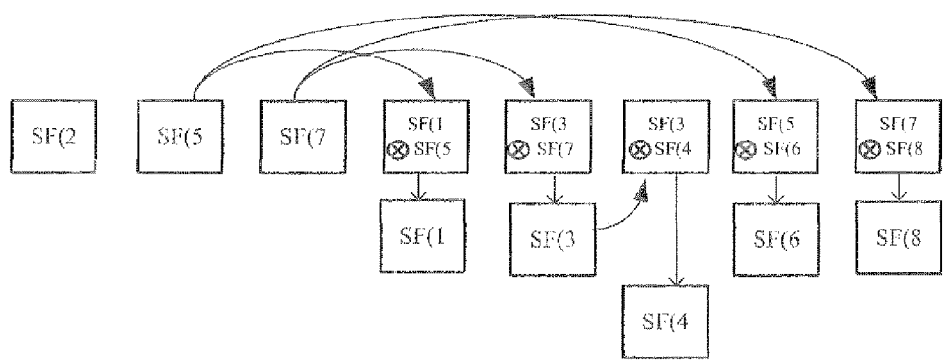

FIG. 21A schematically illustrates CRC cheek results on non-ECC transmission data E(1) and ECC transmission data PE(1) transmitted from radio communication apparatus 600. In FIG. 21A, check marks placed on coding information bits and ECC parity bit components resulting from exclusive ORing the coding information bits mean that CRC checks have failed.

Even in the receiving condition in FIG. 21A, non-ECC transmission data. E(1) can be reproduced by performing erasure correction decoding as shown, for example, in FIG. 21B. That is, by calculating XOR using SF(k) whose CRC check result is OK and ECC parity data PE(k) whose CRC check result is OK, SF(m) whose CRC check result is NG can be reproduced. That is, even when the CRC check result of one of the two coding information bits which are the bases of ECC parity data PE(k) is NG, if the CRC check results of ECC parity data PE(k) and the other coding information bit are OK, the coding information bit whose CRC check result is NG can be reproduced.

Figure 22:
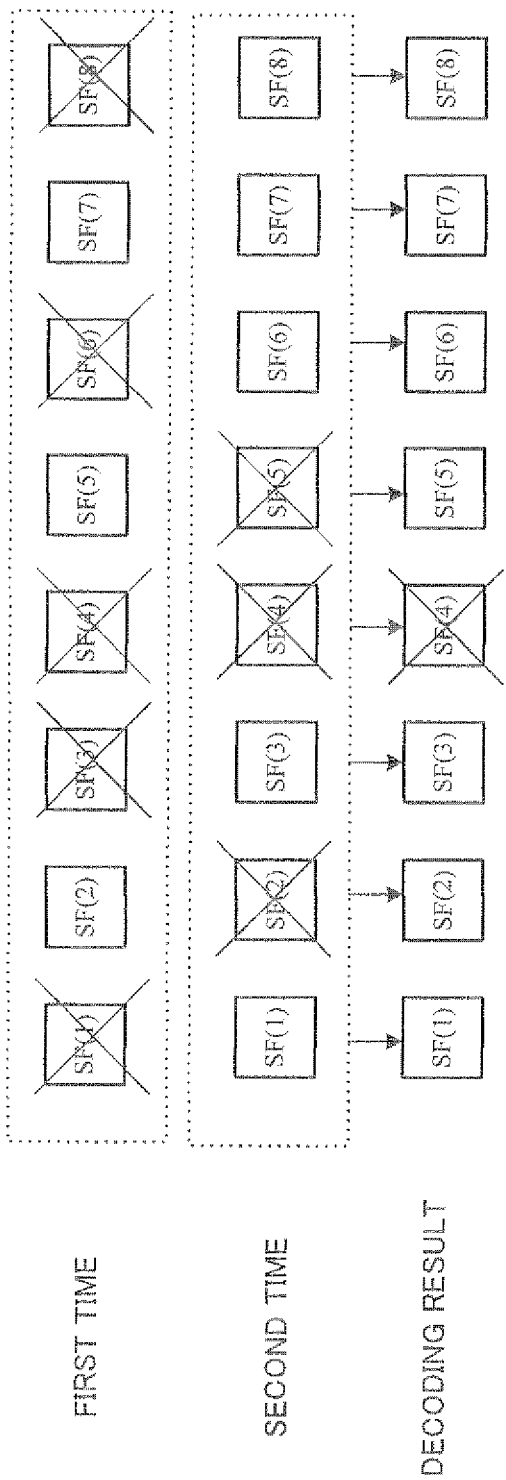
FIG. 22 is a diagram illustrating a comparative example.

FIG. 22 shows a comparative example. In FIG. 22, systematic bit E(1) is sent once again instead of coding parity bit PE(1) in FIG. 21A. That is, in FIG. 22, systematic bit E(1) is subjected to repetition coding processing (here, the number of repetitions is 2), which is conventional low rate coding and then transmitted. As is clear from FIG. 22, even when the CRC check result of second systematic bit E(1) is coding parity bit PEW, systematic bit E(1) cannot be reproduced accurately.

As described above, radio communication apparatus 600 calculates an exclusive OR between each coding base unit and another coding base unit included in subblock E(k) and assumes the result as ECC parity data PE(j). By so doing, higher MBS receiving quality is obtained than repetition transmission by only performing coding processing and decoding processing using simple linear calculations. Furthermore, the error rate is improved even when the rate is the same compared with conventional low rate coding.

Embodiment 6

In Embodiment 1 to Embodiment 5, error correcting coding section 145 encodes transmission data which is duplicated transmission data (that is, the above-described first transmission data) and ECC parity bits obtained by erasure correction encoding section 110 independently of each other using an error correcting coding scheme other than erasure correction coding. By contrast, Embodiment 6 assumes the whole transmission data which is the above-described first transmission data with ECC parity bits added linked into a single piece as a processing target of the error correcting coding section.

Figure 23:
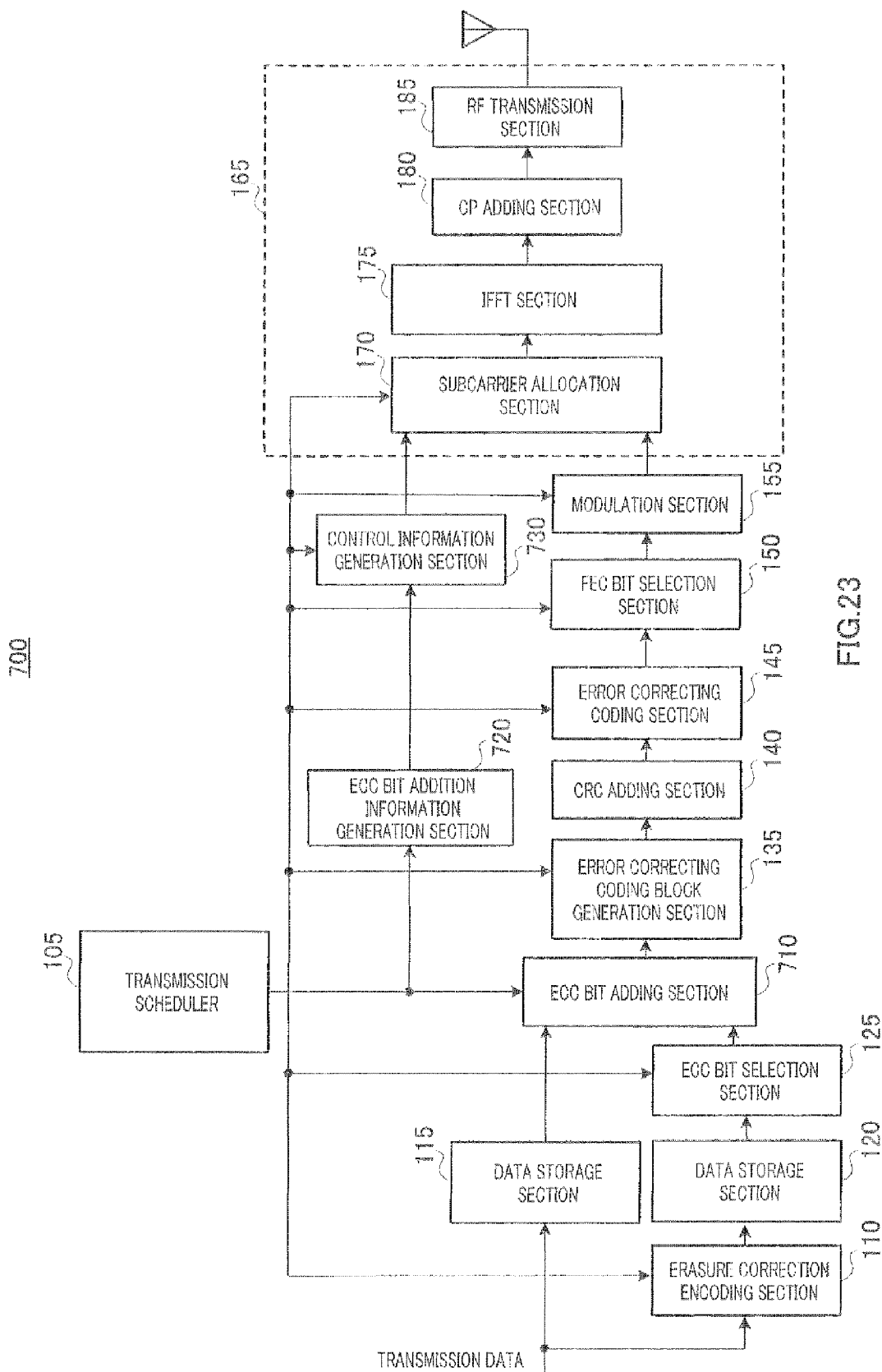
FIG. 23 is a block diagram illustrating a configuration of a radio communication apparatus according to Embodiment 6 of the present invention.

FIG. 23 is a block diagram illustrating a configuration of radio communication apparatus 700 according to Embodiment 6. In FIG. 23, radio communication apparatus 700 includes ECC bit adding section 710, ECC bit addition information generation section 720 and control information generation section 730.

ECC bit adding section 710 adds ECC bit data formed of ECC parity bits selected by ECC bit selection section 125 to transmission data stored on a temporary basis in data storage section 115. ECC bit adding section 710 outputs the whole transmission data with ECC bit data added as a single piece to error correcting coding block generation section 135.

Here, the number of bits of the added ECC bit data is the number of bits calculated from the designated number of bits designated by transmission scheduler 105 or the designated coding rate designated by transmission scheduler 105.

Figure 24:
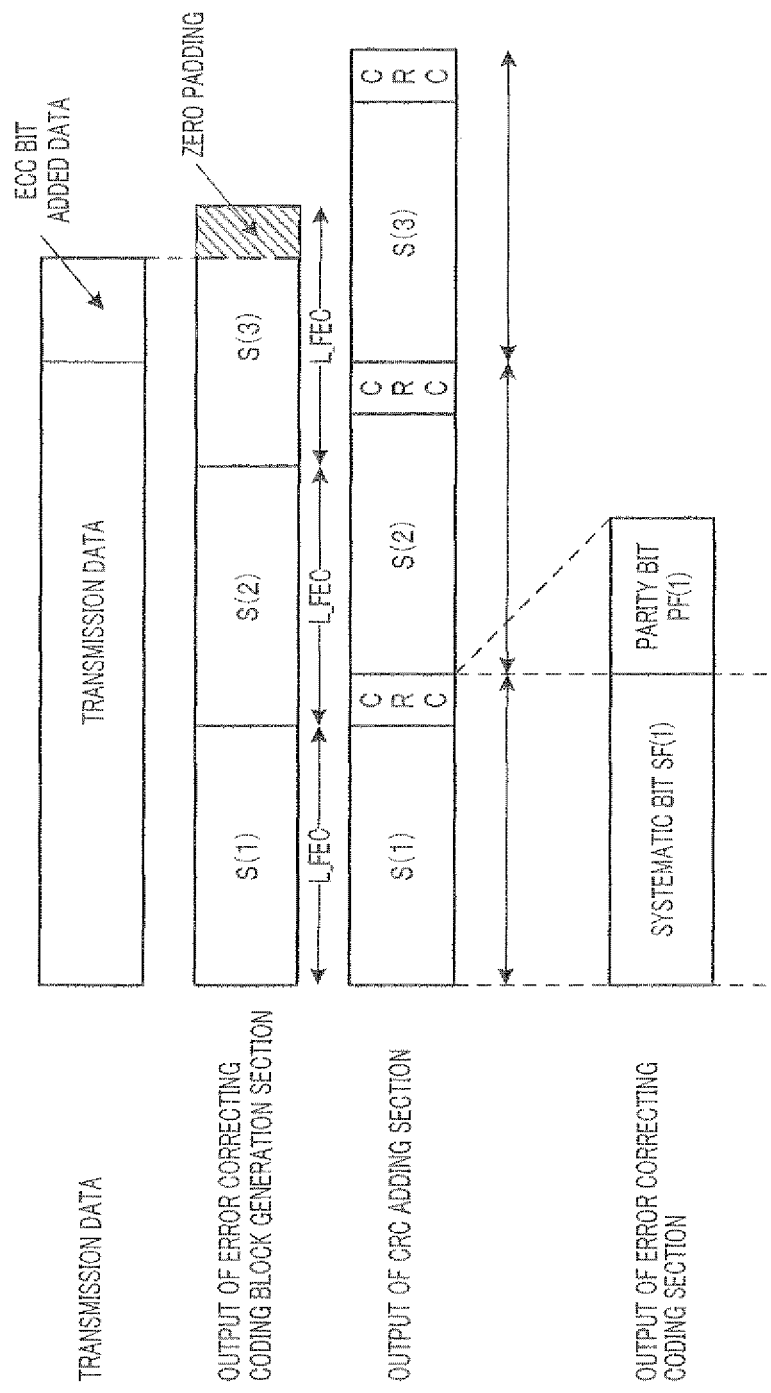
FIG. 24 is a diagram illustrating processing of the error correcting coding block generation section, CRC adding section and error correcting coding section.

FIG. 24 is a diagram illustrating processing of error correcting coding block generation section 135, CRC adding section 140 and error correcting coding section 145.

As shown in FIG. 24, the whole transmission data which is the first transmission data with an ECC parity bit added is inputted as a single piece to error correcting coding block generation section 135.

The input transmission data is divided per L_FEC by error correcting coding block generation section 135. Here, since Jmax=3, three subblocks S(1), S(2) and S(3) are obtained. Since S(3) falls short of a predetermined block size, S(3) is padded so as to reach the predetermined block size.

CRC adding section 140 adds CRC bits to each of S(1), S(2) and S(3) which have reached the predetermined block size. Systematic bits SF(1), SF(2), SF(3) and parity bits PF(1), PF(2) and PF(3) are obtained by performing error correcting coding on S(1), S(2) and S(3) with CRC bits added.

Since the whole transmission data with ECC bit data added is subjected to error correcting coding as a single piece as described above, the ECC transmission data and non-ECC transmission data in Embodiment 1 are transmitted in the same packet in the present embodiment.

Returning to FIG. 23, ECC bit addition information generation section 720 generates information about the number of bits of ECC bit data added by ECC bit adding section 710 (hereinafter may be referred to as "information about the number of bits added") and outputs this to control information generation section 730. Here, as described above, the number of bits added is obtained from the designated number of bits designated by transmission scheduler 105 or the designated coding rate designated by transmission scheduler 105. Therefore, the information about the number of bits added here includes the designated number of bits or designated coding rate.

Figure 25:
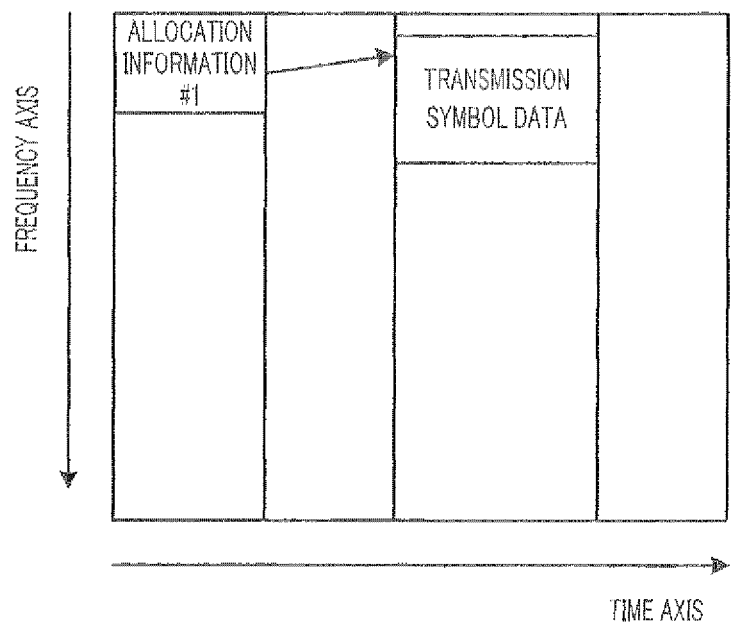
FIG. 25 is a diagram illustrating variations of resource allocation.

Control information generation section 730 generates control information to report the resource allocation information received from transmission scheduler 105 to the radio terminal apparatus. Here, as described above, the ECC transmission data and non-ECC transmission data in Embodiment 1 are transmitted in the same packet in Embodiment 6. Therefore, control information generation section 730 requires only one piece of allocation information (allocation information #1 in the figure) corresponding to the transmission symbol data obtained from the ECC transmission data and non-ECC transmission data as shown in FIG. 25.

Here, the allocation information corresponding to the transmission symbol data includes the position (on the frequency axis/time axis), data length, MCS information, multicast identification (e.g. M-CID #1) information and information about the number of bits added of the transmission symbol data. When the bit length of CRC bits is known, the data length of such data is calculated using L_FEC, the number of L_FEC subblocks, MCS information and information about the number of bits added. Therefore, L_FEC and the number of subblocks of L_FEC may also be included instead of the data length.

Here, since the transmission symbol data includes non-ECC symbol data and ECC symbol data, the present embodiment requires only one piece of allocation information. However, if the non-ECC symbol data and ECC symbol data are simply put together, the receiving side cannot separate the ECC symbol data from other bit data (transmission data). By contrast, since information about added bits is included in the allocation information in the present embodiment, the receiving side can separate the ECC bit data from the other bit data (transmission data). This allows the radio terminal apparatus to perform two-step decoding processing. Therefore, power consumption on the receiving side can be reduced and receiving quality of transmission data by ECC decoding can be improved.

Figure 26:
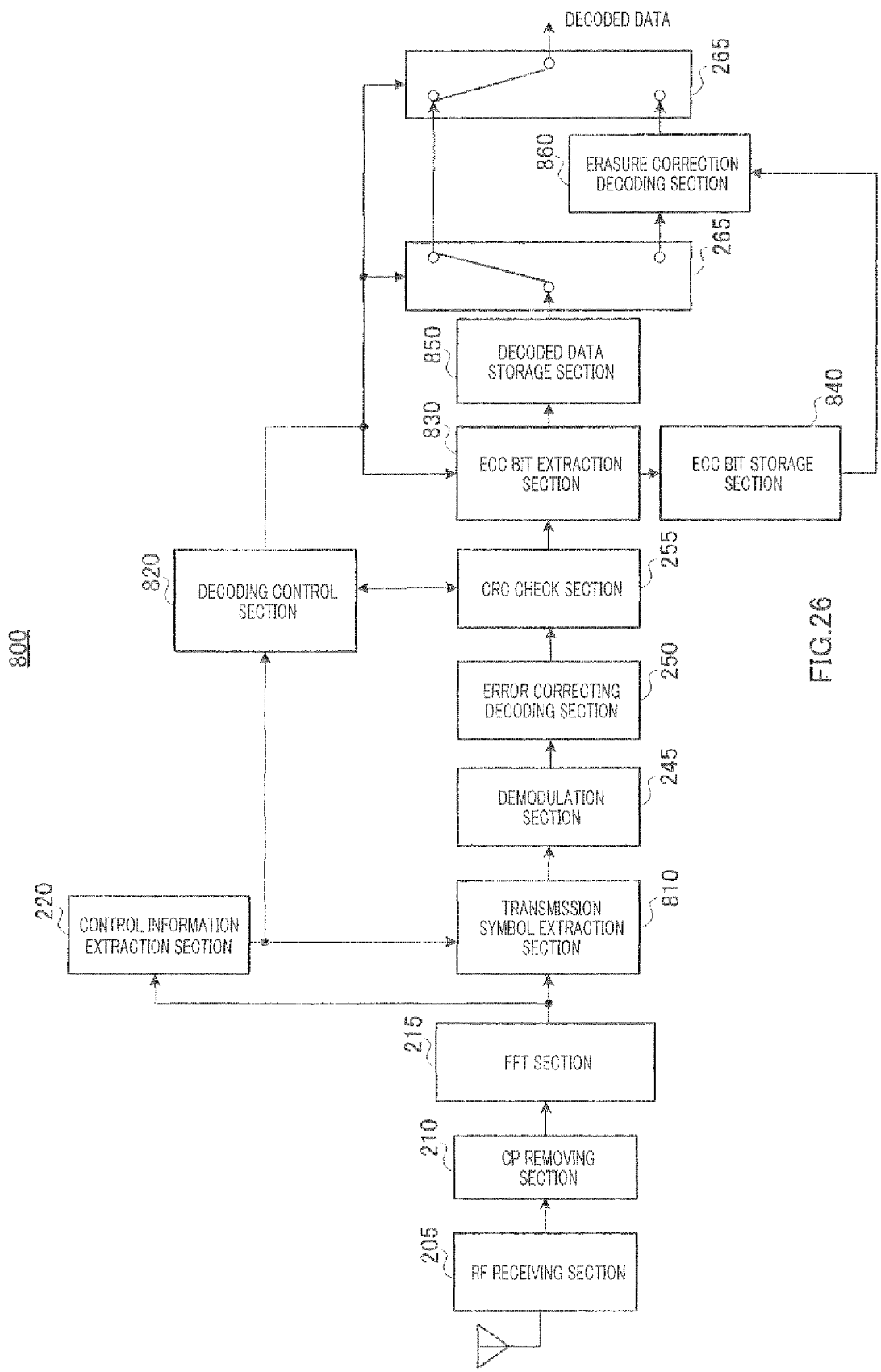
FIG. 26 is a block diagram illustrating a configuration of a radio terminal apparatus according to Embodiment 6 of the present invention.

FIG. 26 is a block diagram illustrating a configuration of radio terminal apparatus 800 according to Embodiment 6. In FIG. 26, radio terminal apparatus 800 includes transmission symbol extraction section 810, decoding control section 820, ECC bit extraction section 830, ECC bit storage section 840, decoded data storage section 850 and erasure correction decoding section 860.

Transmission symbol extraction section 810 extracts transmission symbol data from a received signal after OFDM demodulation based on allocation information #1 extracted by control information extraction section 220.

Decoding control section 820 controls decoding processing by radio terminal apparatus 800.

ECC bit extraction section 830 determines whether or not the subblock error correcting decoding result received from CRC check section 255 includes ECC bits and outputs the error correcting decoding result to ECC bit storage section 840 or decoded data storage section 850 according to the determination result.

Erasure correction decoding section 860 performs erasure correction decoding processing using the data received from decoded data storage section 850 and data stored in ECC bit storage section 840.

Figure 27:
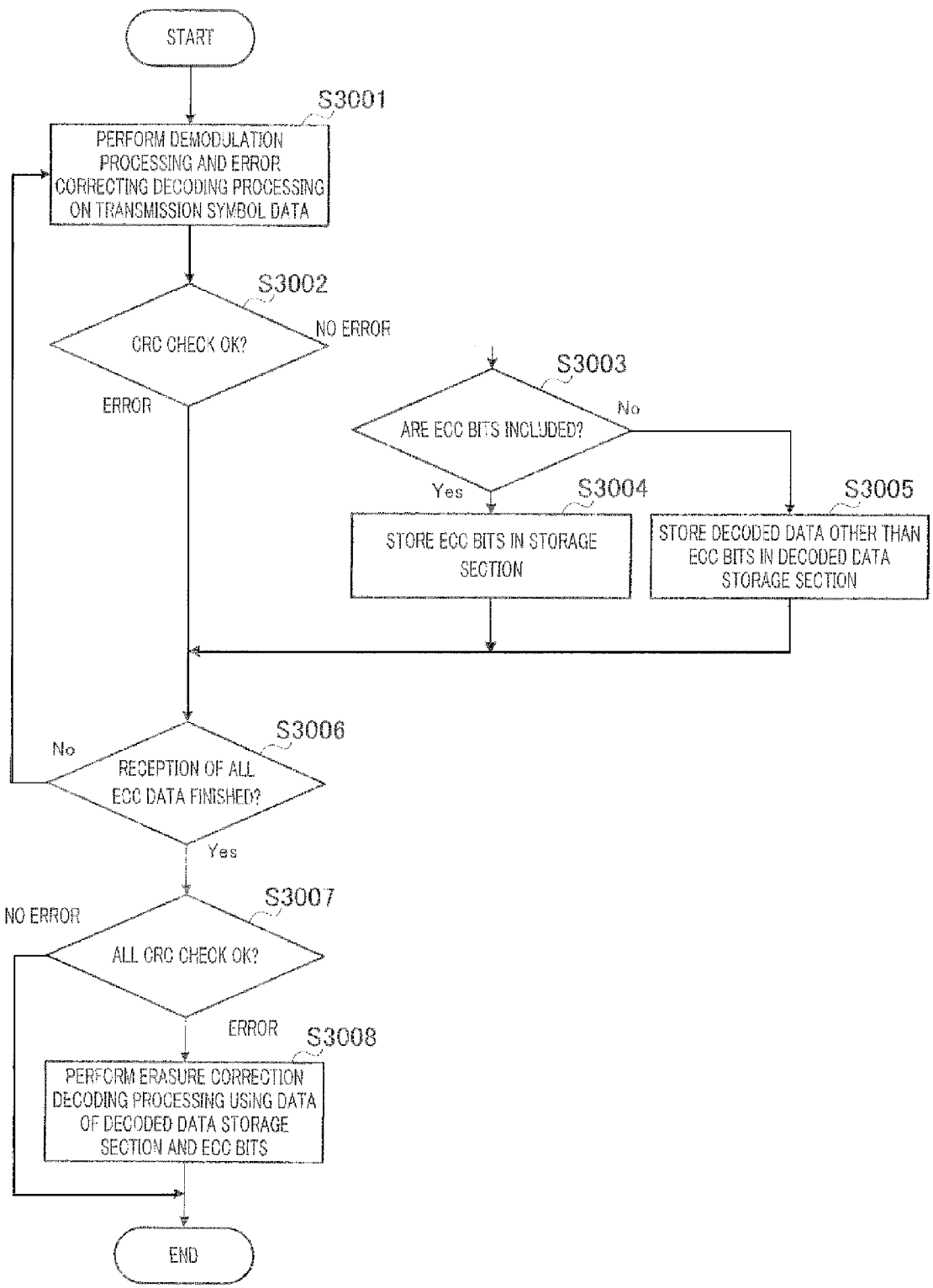
FIG. 27 is a flowchart of decoding processing.

FIG. 27 is a flowchart of decoding processing. The decoding processing is performed primarily under the control of decoding control section 820.

A transmission symbol extracted by transmission symbol extraction section 810 is subjected to error correcting decoding processing by demodulation section 245 and error correcting decoding section 250 (step S3001).

In step S3002, CRC check section 255 checks whether or not there are errors in the error correcting decoding processing result. Here, CRC check is performed per subblock. Furthermore, subblocks decided not to include errors as a result of the error correcting decoding processing have the CRC bits removed, and inputted to ECC bit extraction section 830.

In step S3003, ECC bit extraction section 830 decides whether or not the subblock error correcting decoding result received from CRC check section 255 includes ECC bits.

When it is decided in step S3003 that ECC bits are included, ECC bit extraction section 830 outputs the error correcting decoding result to ECC bit storage section 840 and to be stored therein (step S3004).

On the other hand, when it is decided in step S3003 that ECC bits are not included, ECC bit extraction section 830 outputs the error correcting decoding result to decoded data storage section 850 to be stored therein (step S3005).

The processing in step S3001 to 3005 is repeated until the processing is performed on all subblocks included in the transmission symbol in step S3006.

After the processing in steps S3001 to 3005 is performed on all subblocks, decoding control section 820 decides in step S3007 whether or not errors are detected in all subblocks. The decision result shows that no errors are detected in any subblocks, padding bits are removed from the error correcting decoding result stored in decoded data storage section 850. The decoding processing on the data transmitted from radio communication apparatus 700 is finished in this way. In this case, since the ECC decoding processing need not be performed, it is possible to reduce power consumption in radio terminal apparatus 800 and also reduce processing delays.

When the decision result in step S3007 shows that errors are detected in at least some subblocks, decoding control section 820 changes switch 265 to the erasure correction decoding section 860 side and makes decoded data storage section 850 output the data to erasure correction decoding section 860.

In step S3008, erasure correction decoding section 860 executes erasure correction decoding processing using the data received from decoded data storage section 850 and the data stored in ECC bit storage section 840. When no error is detected in the erasure correction decoding processing result, padding bits are removed from the erasure correction decoding result. Thus, decoding processing on the data transmitted from radio communication apparatus 700 is finished.

Embodiment 7

In Embodiment 7, a plurality of types of ECC transmission data are transmitted.

Figure 28:
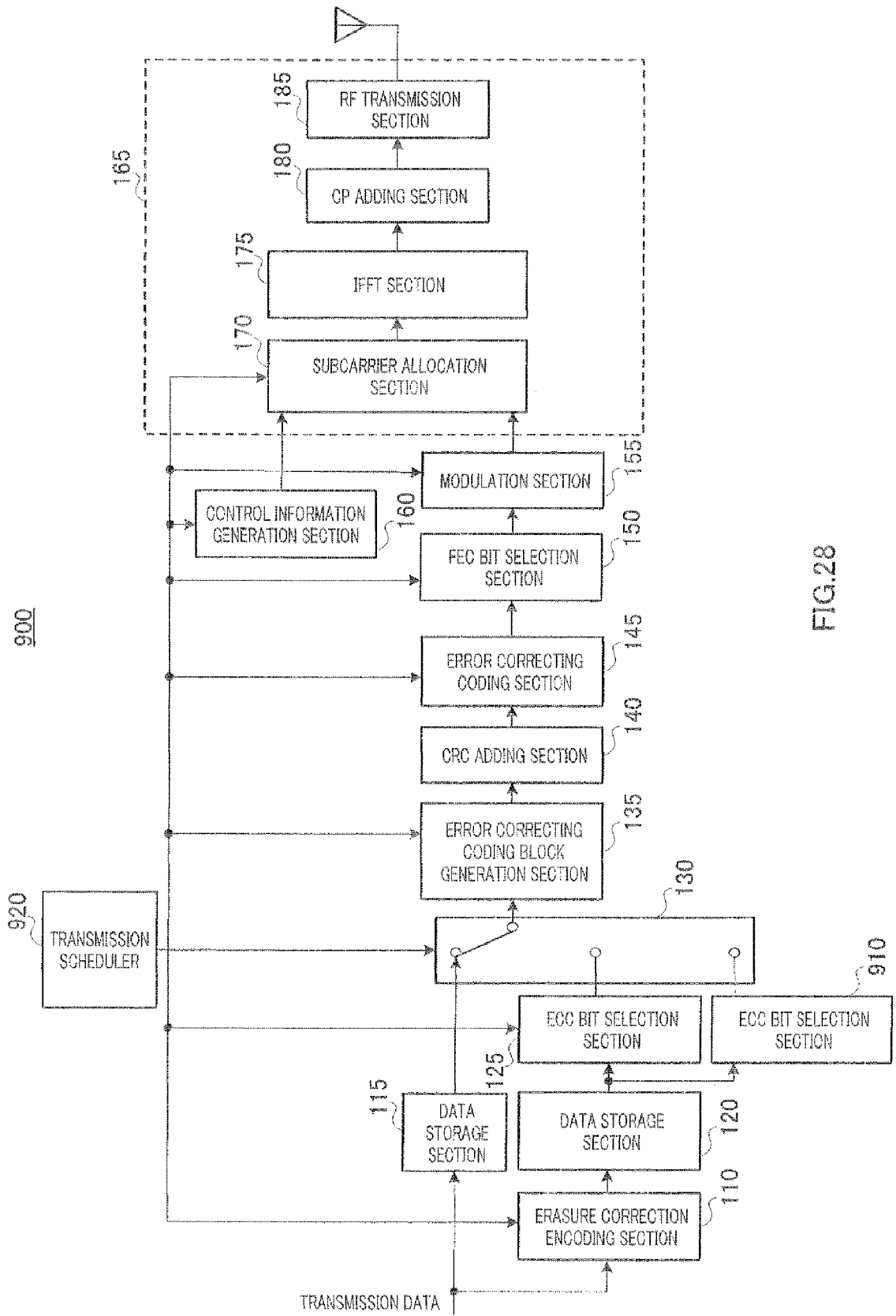
FIG. 28 is a block diagram illustrating a configuration of a radio communication apparatus according to Embodiment 7 of the present invention.

FIG. 28 is a block diagram illustrating a configuration of radio communication apparatus 900 according to Embodiment 7. In FIG. 28, radio communication apparatus 900 includes second ECC bit selection section 910 parallel to ECC bit selection section 125. The number of ECC bit selection sections provided parallel to ECC bit selection section 125 is not limited to one. That is, radio communication apparatus 900 may have N_E (N_E is a natural number equal to or greater than 2) ECC bit selection sections.

ECC bit selection section 125 receives systematic bits and parity bits from erasure correction encoding section 110. ECC bit selection section 125 then preferentially selects parity bits of higher importance that effectively contribute to ECC error correction from among the received parity bits, punctures the selected parity bits and thereby adjusts the parity bits to a designated coding rate.

ECC bit selection section 910 receives systematic bits and parity bits from erasure correction encoding section 110 in the same way as in ECC bit selection section 125. ECC bit selection section 910 further preferentially selects bits of higher importance that effectively contribute to ECC error correction from among parity bits not selected by first ECC bit selection section 125, punctures the selected parity bits and thereby adjusts the parity bits to a designated coding rate.

Switch 130 selectively outputs the data stored in data storage section 115, data obtained by ECC bit selection section 125 (that is, first ECC transmission data) or data obtained by ECC bit selection section 910 (that is, second ECC transmission data) to error correcting coding block generation section 135. That is, by changing switch 130, the data stored in data storage section 115, data obtained by ECC bit selection section 125 and data obtained by ECC bit selection section 910 are outputted to error correcting coding block generation section 135 by time division.

Figure 29:
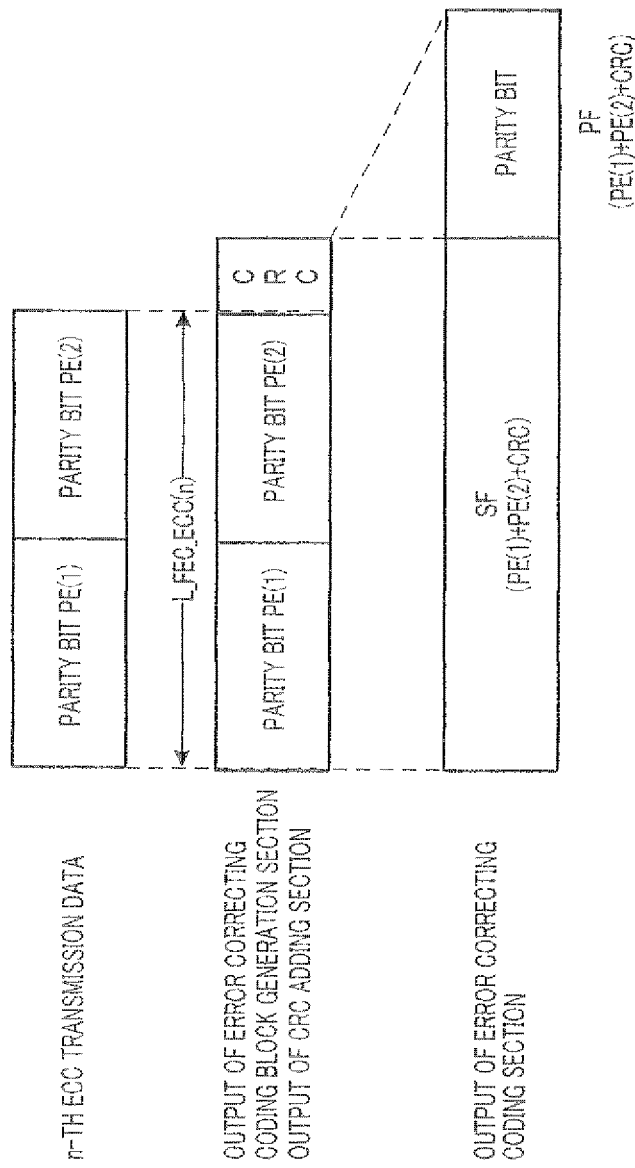
FIG. 29 is a diagram illustrating processing steps on n-th ECC transmission data by the error correcting coding block generation section, CRC adding section and error correcting coding section.

Error correcting coding block generation section 135 performs processing similar to that on the first ECC transmission data on the second ECC transmission data as well. FIG. 29 illustrates steps of processing on n-th ECC transmission data by error correcting coding block generation section 135, CRC adding section 140 and error correcting coding section 145.

Subcarrier allocation section 170 allocates non-ECC transmission symbol data, and first and second ECC transmission symbol data to subcarriers in a predetermined OFDM symbol based on resource allocation information received from transmission scheduler 105. Furthermore, subcarrier allocation section 170 receives control information from control information generation section 160 and maps the control information to predetermined time (OFDM symbol) and frequency (subcarrier) resources.

Figure 30:
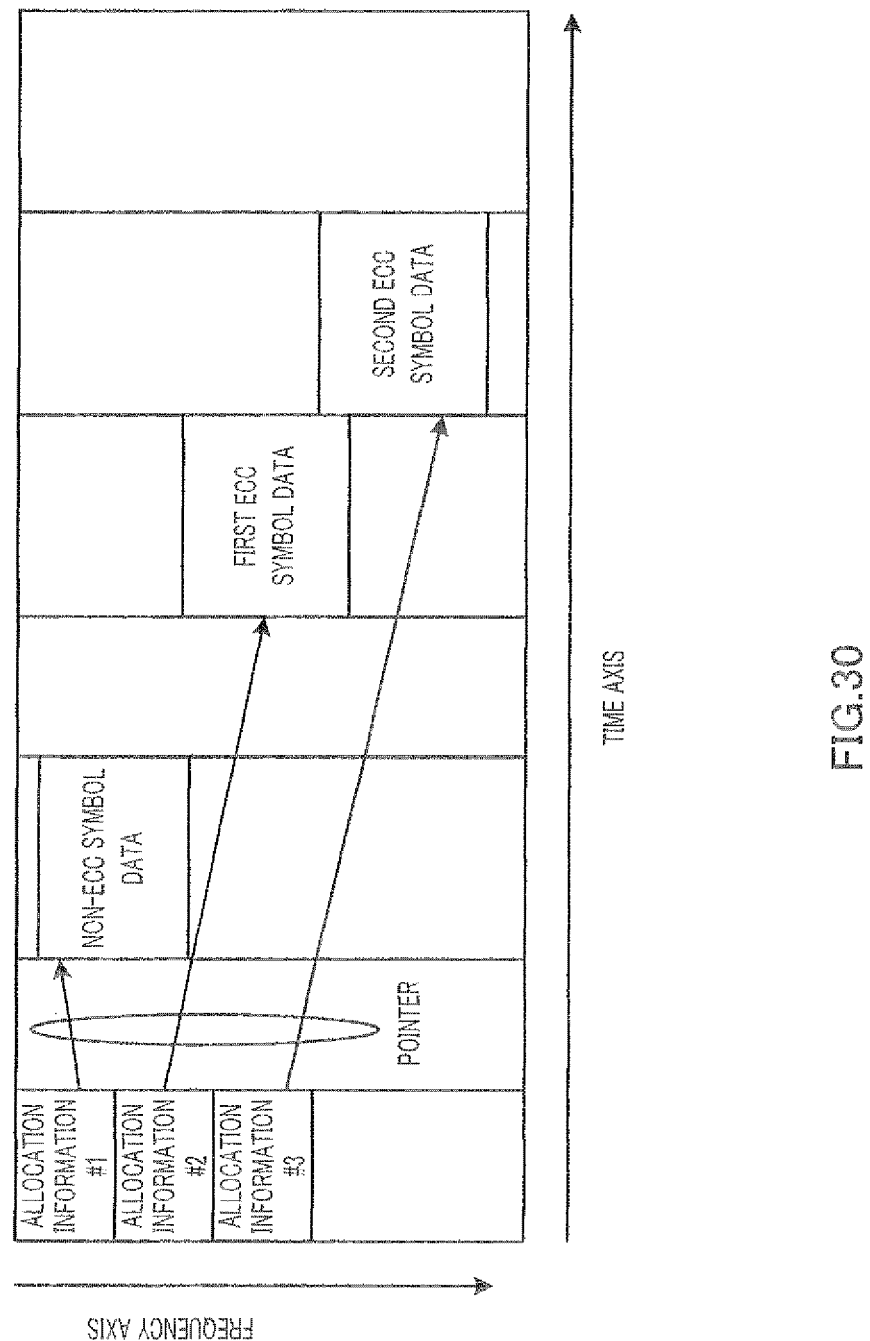
FIG. 30 is a diagram illustrating an example of resource allocation.

FIG. 30 illustrates an example of resource allocation. Here, allocation information #1 represents allocation information corresponding to non-ECC symbol data #1 obtained from transmission data #1. Allocation information #1 includes the position (on the frequency axis/time axis), data length, MCS information and multicast identification (e.g. M-CID #1) information of non-ECC symbol data.

Furthermore, allocation information #2 and #3 represent allocation information corresponding to the first and second ECC symbol data respectively. Allocation information #2 and #3 include the position (on the frequency axis/time axis), data length, MCS information, multicast identification (e.g. M-CID #1) information and coding information (e.g. including ECC specification identification information, ECC coding rate information and ECC bit selection method) of ECC symbol data. That is, allocation information #s represents allocation information corresponding to (s–1)-th. ECC symbol data and includes contents similar to those of above allocation information #2 and #3. However, s is a natural number equal to or greater than 2 and equal to or smaller than N_K+1.

When the bit length of CRC bits is known, the data length included in allocation information #1 can be calculated using L_FEC, the number of subblocks of L_FEC and MCS information. Therefore, L_FEC and the number of subblocks of L_FEC may also be included in allocation information #1 instead of the data length. Furthermore, when the bit length of CRC bits is known, the data length included in allocation information #2 can also be calculated using L_FEC_ECC(s), the number of subblocks of L_FEC_ECC(s) and MCS information. Therefore, L_FEC_ECC(s) and the number of subblocks of L_FEC_ECC(s) may also be included in allocation information #s instead of the data length.

In FIG. 30, the first FCC symbol data is mapped to an OFDM symbol that is a predetermined number of OFDM symbols apart from the OFDM symbol to which non-ECC symbol data is mapped. Furthermore, the second ECC symbol data is mapped to an OFDM symbol that is a predetermined number of OFDM symbols apart from the OFDM symbol to which the first ECC symbol data is mapped.

In this case, the receiving side can decide whether or not the ECC symbol data needs to be received based on the reception result of the non-ECC symbol data sent beforehand. Therefore, when the non-ECC symbol data has been successfully received without errors, the ECC symbol data is not subjected to reception processing and power consumption of MS can thereby be reduced further.

Furthermore, since a plurality of pieces of ECC transmission symbol data are transmitted at time intervals, the receiving side can perform decoding using ECC transmission symbol data step by step. That is, it is possible to decide whether or not the second ECC symbol data needs to be received based on the reception result of the first ECC symbol data sent beforehand. Therefore, when the non-ECC symbol data and first ECC symbol data have been successfully received without errors, the second ECC symbol data is not subjected to reception processing and power consumption of MS can thereby be reduced.

Figure 31:
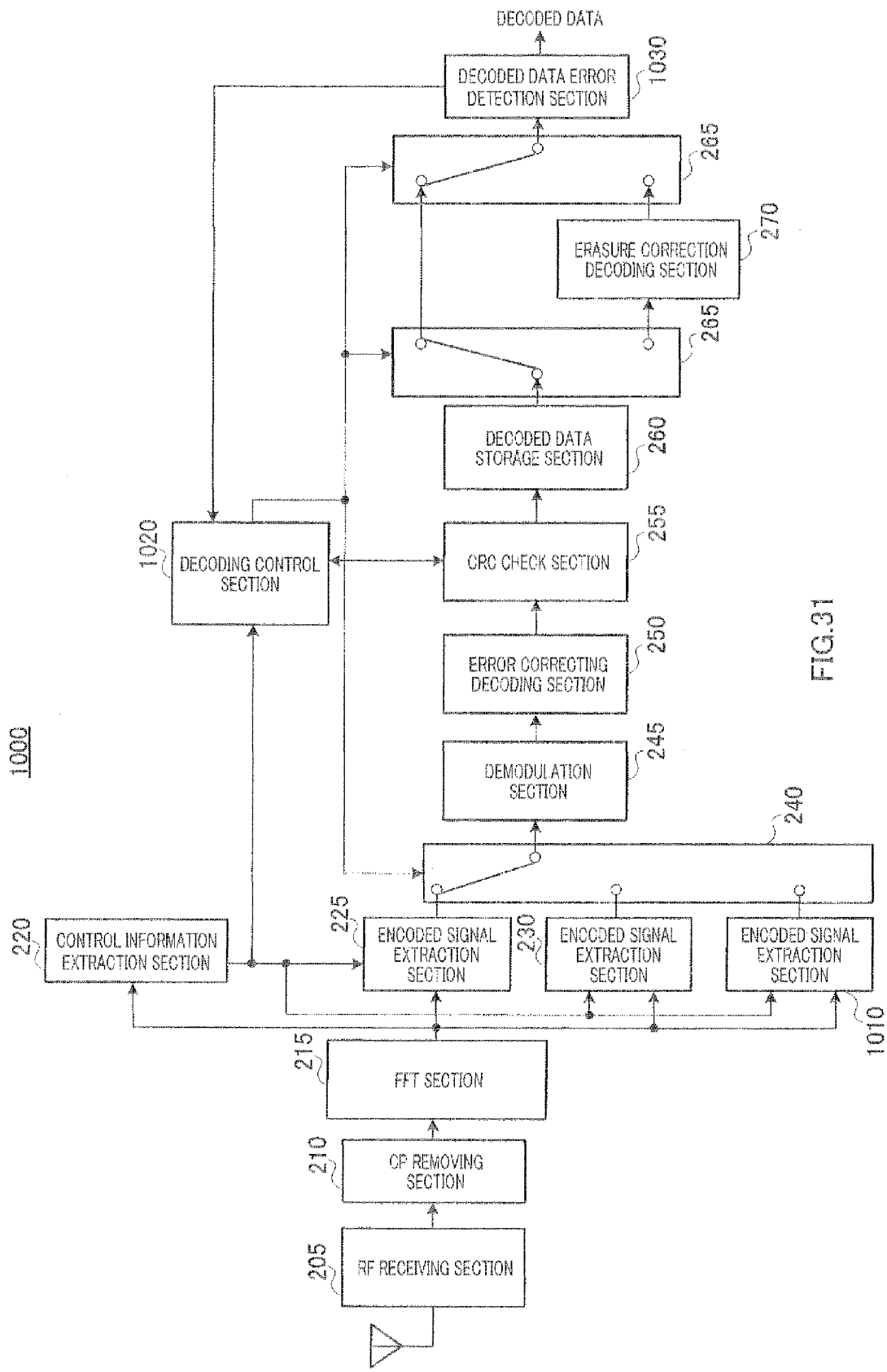
FIG. 31 is a block diagram illustrating a configuration of a radio terminal apparatus according to Embodiment 7 of the present invention.

FIG. 31 is a block diagram illustrating a configuration of radio terminal apparatus 1000 according to Embodiment 7. In FIG. 31, radio terminal apparatus 1000 includes encoded signal extraction section 1010 provided parallel to encoded signal extraction section 225 and encoded signal extraction section 230, decoding control section 1020 and decoded data error detection section 1030. The number of encoded signal extraction sections provided for radio terminal apparatus 1000 matches the number of ECC bit selection sections provided for radio communication apparatus 900.

Encoded signal extraction section 1010 extracts second ECC transmission symbol data from a received signal after OFDM demodulation based on allocation information #3 extracted by control information extraction section 220.

Decoding control section 1020 controls decoding processing in radio terminal apparatus 1000.

Decoded data error detection section 1030 detects errors in an erasure correction decoding result and outputs the detection result to decoding control section 1020.

Figure 32:
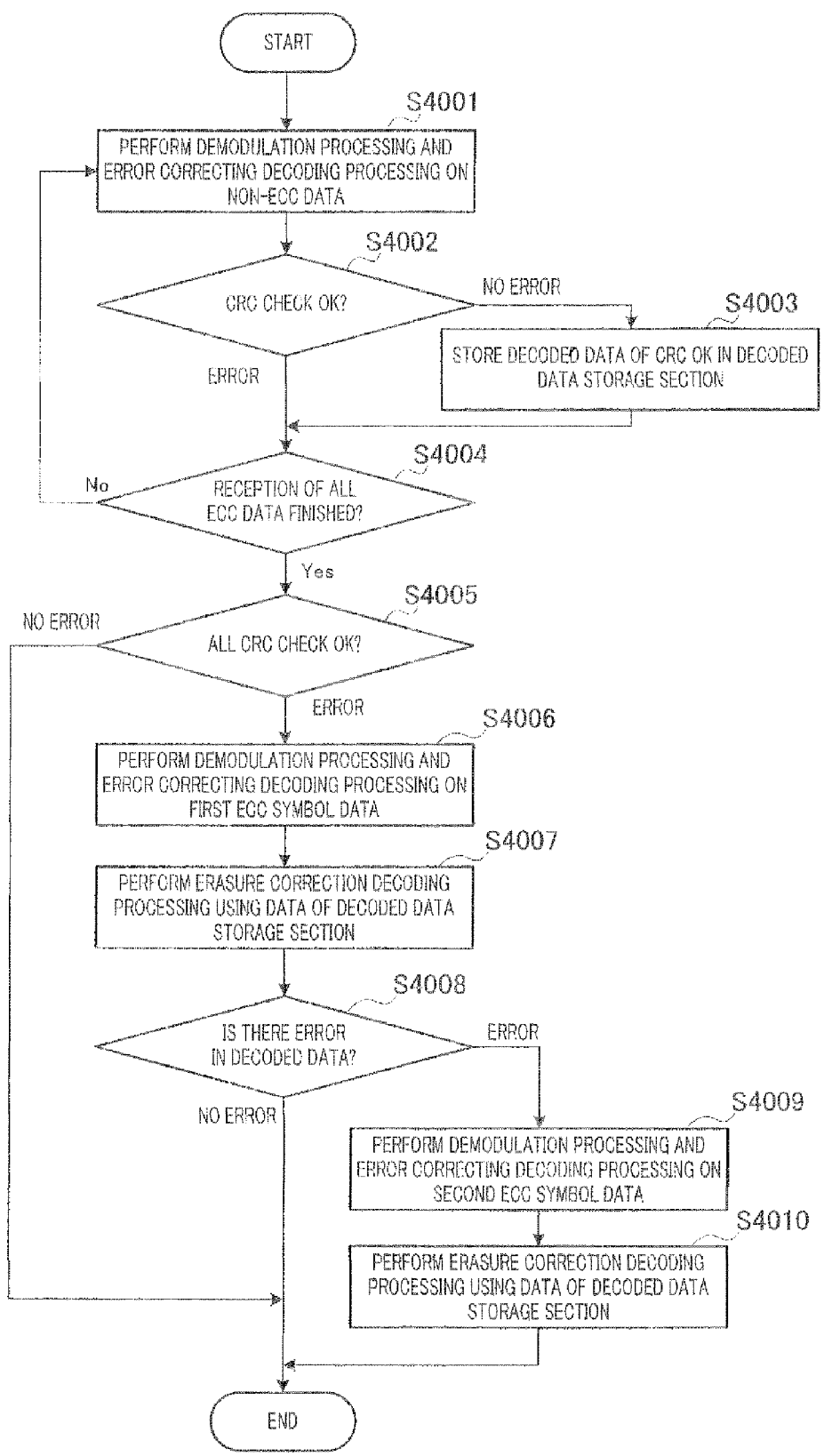
FIG. 32 is a flowchart of decoding processing.

FIG. 32 is a flowchart of decoding processing. The decoding processing is performed primarily under the control of decoding control section 1020.

The processing in steps S4001 to S4007 in FIG. 32 is similar to the processing in steps S2001 to S2007 in FIG. 10. However, first ECC symbol data is used in steps S4006 and S4007.

In step S4008, decoded data error detection section 1030 checks whether or not there are errors in the erasure correction decoding result obtained in step S4007. As a result, when no error is detected, the decoding processing on the data transmitted from radio communication apparatus 900 is finished.

On the other hand, when errors are detected in step S4008, decoding control section 1020 changes switch 240 to the encoded signal extraction section 1010 side and makes encoded signal extraction section 1010 output second ECC symbol data. In step S4009, the second ECC symbol data is subjected to demodulation processing and error correcting decoding processing by demodulation section 245 and error correcting decoding section 250.

Figure 33:
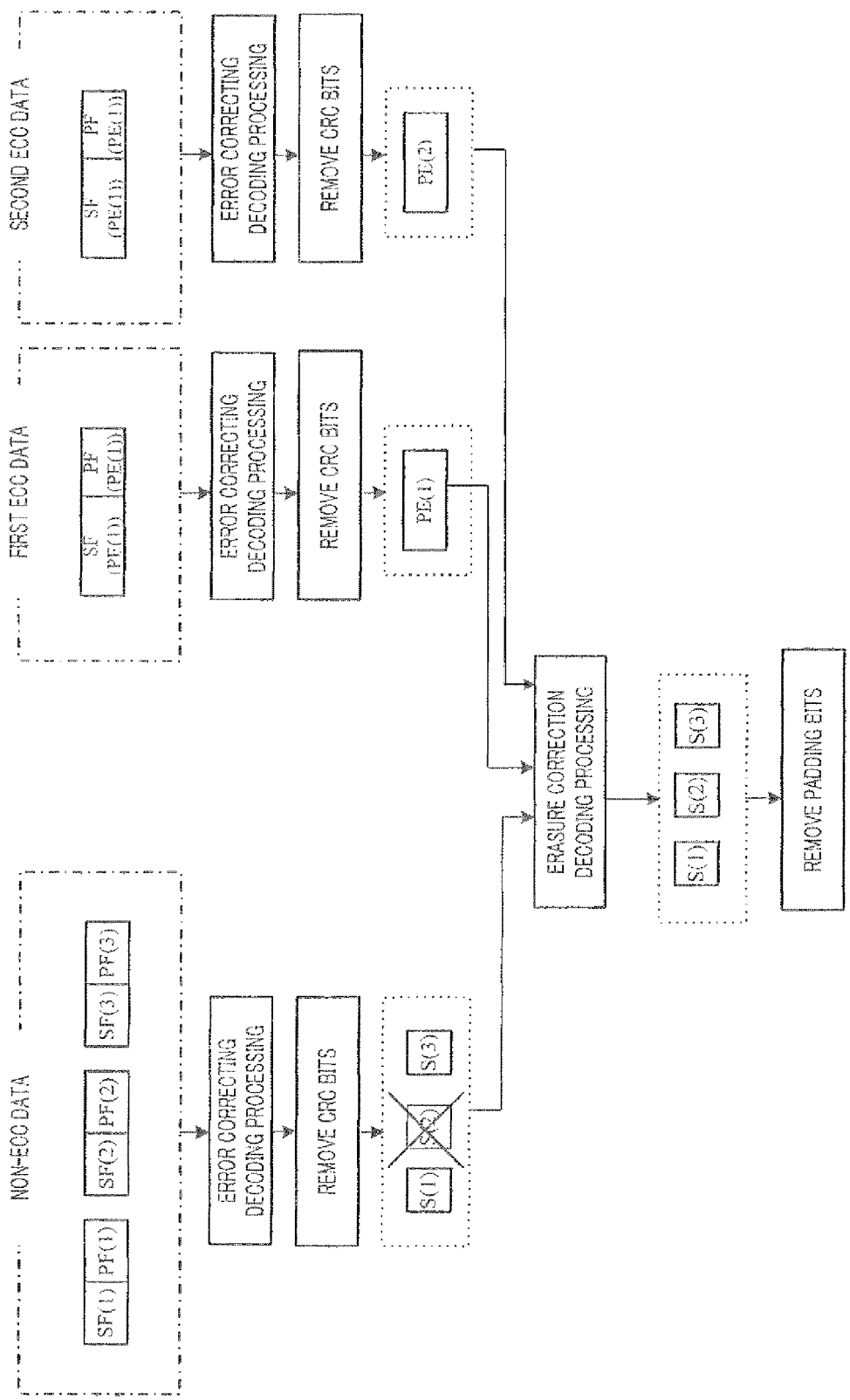

In step S4010, decoding control section 1020 changes switch 265 to the erasure correction decoding section 270 side, makes decoded data storage section 260 output the data for erasure correction decoding processing, and makes erasure correction decoding section 270 perform erasure correction decoding. When no error is detected in the erasure correction decoding processing result, padding bits are removed from the erasure correction decoding result. Thus, the decoding processing on the data transmitted from radio communication apparatus 900 is finished. FIG. 33 schematically illustrates steps of decoding processing or the like when an error is detected in the non-ECC symbol data, an error is detected in the first ECC symbol data and no error is detected in the second ECC symbol data.

Other Embodiments (1) The techniques described in Embodiments 1 to 7 are applicable to a system to which IEEE802.16m Enhanced- MBS (E-MBS) standard, which is the next-generation standard of IEEE802.16e, is applied. Of the terms used in the respective embodiments, "allocation information" corresponds to DL-MAP information of the 1.6 m E-MBS standard (MBS-MAP information in the MBS standard in particular). Furthermore, "multicast identification information" corresponds to multicast-connection identifier of the 16 m E-MBS standard. Furthermore, "symbol data" corresponds to downlink burst data of the 16 m E-MBS standard. Furthermore, "MCS information" corresponds to downlink interval usage code (DIUC).

(2) Furthermore, although cases have been described in Embodiments 1 to 7 where the present invention is configured by hardware, the present invention may be implemented by software.

Each function block employed in the description of the aforementioned embodiment may typically be implemented as an LSI constituted by an integrated circuit. These may be individual chips or partially or totally contained on a single chip. "LSI" is adopted here but this may also be referred to as "IC," "system LSI," "super LSI" or "ultra LSI" depending on differing extents of integration.

Further, the method of circuit integration is not limited to LSI's, and implementation using dedicated circuitry or general purpose processors is also possible. After LSI manufacture, utilization of an FPGA (Field Programmable Gate Array) or a reconfigurable processor where connections and settings of circuit cells within an LSI can be reconfigured is also possible.

Further, if integrated circuit technology comes out to replace LSI's as a result of the advancement of semiconductor technology or a derivative other technology, it is naturally also possible to carry out function block integration using this technology. Application of biotechnology is also possible.

The disclosure of Japanese Patent Application No. 2008-273442, filed on Oct. 23, 2008, including the specification, drawings and abstract, is incorporated herein by reference in its entirety.

INDUSTRIAL APPLICABILITY

The radio communication apparatus and encoded data transmitting method of the present invention are capable of reducing power consumption on the receiving side according to a receiving condition while maintaining a resource-saving effect by ECC application.

The invention claimed is:

1. A radio transmission apparatus comprising:
a first encoding section that first-encodes transmission data using a first encoding method and outputs first-encoded data;
a first padding section that adjusts size of the transmission data for first-encoding of the first encoding section by zero padding;
a second encoding section that second-encodes the first-encoded data using a second encoding method, and second-encodes the transmission data using the second encoding method independently of the second-encoding of the first-encoded data, and outputs second-encoded data;
a second padding section that adjusts size of the transmission data for second-encoding of the second encoding section by zero padding, the size of zero padding of the second padding section being same as that of the first padding section; and
a transmission section that transmits the second-encoded data,
wherein a coding unit length in the first encoding section is a natural number multiple of a coding unit length in the second encoding section.

2. The radio transmission apparatus according to claim 1, wherein an erasure correction coding is used as the first encoding method.

3. The radio transmission apparatus according to claim 1, wherein a systematic code is used as the first encoding method and the second encoding method.

4. The radio transmission apparatus according to claim 3, wherein the first-encoded data is parity bits subjected to systematic encoding bit data.

5. The radio transmission apparatus according to claim 1, wherein a coding unit length in the first encoding section is greater than a coding unit length in the second encoding section.

6. The radio transmission apparatus according to claim 1, further comprising a control information generation section that generates control information comprising first resource allocation information, second resource allocation information and identification information that associates the first resource with the second resource, wherein the transmission section allocates data corresponding to the transmission data included in the second-encoded data to the first resource and allocates data corresponding to the first-encoded data included in the second-encoded data to the second resource and transmits the allocated data.

7. The radio transmission apparatus according to claim 1, wherein the allocation information of the second resource includes a coding rate of the first encoding section and a coding rate of the second encoding section.

8. The radio transmission apparatus according to claim 1, further comprising a suppressing section that suppresses a coding by the first encoding section, a coding of the first-encoded data by the second encoding section and a transmission of data corresponding to the first-encoded data in the second-encoded data, according to the data size of the transmission data.

9. The radio transmission apparatus according to claim 1, further comprising a combining section that combines the transmission data with subsequent transmission data according to the data size of the transmission data, wherein the first encoding section and the second encoding section encode the combined transmission data.

10. An encoded data transmission method comprising:
first-encoding transmission data using a first encoding method and outputting the first-encoded data;
first padding that adjusts size of the transmission data for the first-encoding by zero padding;
second-encoding the first-encoded data using a second encoding method, and second-encoding the transmission data using the second encoding method independently of the second-encoding of the first-encoded data, and outputting second-encoded data;
second padding that adjusts size of the transmission data for the second-encoding by zero padding, the size of zero padding of the second padding being same as that of the first padding; and
transmitting the second-encoded data,
wherein a coding unit length in the first-encoding is a natural number multiple of a coding unit length in the second-encoding.

11. A radio reception apparatus comprising:
a reception section that receives first data, which is generated by first-encoding transmission data using a first encoding method, first padding that adjusts size of the transmission data for the first-encoding by zero padding, and second-encoding the first-encoded transmission data using a second encoding method, and second data, which is generated by second-encoding the transmission data using the second encoding method independently of the second-encoding of the first-encoded transmission data and second padding that adjusts size of the transmission data for the second-encoding by zero padding, wherein a coding unit length in the first-encoding is a natural number multiple of a coding unit length in the second-encoding, and the size of zero padding of the first padding is same as that of the second padding;

a first decoding processing section that decodes the second data;

an error detection section that performs error detection of the decoding result in the first decoding processing section;

a deciding section that decides whether second decoding processing is necessary based on a condition of the error detection; and a second decoding section that decodes, when the decision result is that the second decoding processing is necessary, the first data using the second decoding processing.

12. The radio reception apparatus according to claim 11, wherein the deciding section stops, when the error detection section detects no error, the second decoding processing by the second decoding section and performs, when the error detection section detects an error, the second decoding processing by the second decoding section.

13. The radio reception apparatus according to claim 11, further comprising a third decoding processing section that performs a decoding processing using both the decoding result of the first decoding processing section and the decoding result of the second decoding processing section.

14. The radio reception apparatus according to claim 13, wherein the third decoding processing section performs an erasure correction decoding processing.

15. An encoded data reception method comprising:

receiving first data, which is generated by first-encoding transmission data using a first encoding method, first padding that adjusts size of the transmission data for the first-encoding by zero padding, and second-encoding the first-encoded transmission data using a second encoding method, and second data which is generated by second-encoding the transmission data using the second encoding method independently of the second-encoding of the first-encoded transmission data and second padding that adjusts size of the transmission data for the second-encoding by zero padding, wherein a coding unit length in the first-encoding is a natural number multiple of a coding unit length in the second-encoding, and the size of zero padding of the first padding is same as that of the second padding;

decoding the second data;

performing error detection of the decoded second data;

deciding whether second decoding processing is necessary based on a condition of the error detection; and decoding, when the decision result is that the second decoding processing is necessary, the first data using the second decoding processing.

\* \* \* \* \*